United States Patent
Vail et al.

(10) Patent No.: US 6,760,151 B1
(45) Date of Patent: Jul. 6, 2004

(54) DEPOLARIZED SEMICONDUCTOR LASER SOURCES

(75) Inventors: Edward C. Vail, Menlo Park, CA (US); Mehrdad Ziari, Pleasanton, CA (US); Bernard Fidric, Cupertino, CA (US); Jianping Zhang, Milpitas, CA (US); Stuart MacCormack, Mountain View, CA (US); Vincent E. Dominic, Fremont, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/559,936

(22) Filed: Apr. 27, 2000

(51) Int. Cl.$^7$ .............................. H01S 3/00; H01S 3/10

(52) U.S. Cl. ...................... 359/341.3; 359/334; 372/27

(58) Field of Search .............................. 359/341.3, 334; 372/6, 27

(56) References Cited

U.S. PATENT DOCUMENTS

| | | |
|---|---|---|
| 4,394,069 A | 7/1983 | Kaye |
| 4,500,178 A | 2/1985 | Yeh |
| 4,572,608 A | 2/1986 | Mochizuki et al. |
| 5,218,652 A | 6/1993 | Lutz ........................... 385/11 |
| 5,247,378 A | 9/1993 | Miller |
| 5,321,503 A | 6/1994 | Bramson |
| 5,430,795 A | 7/1995 | Taga et al. |
| 5,477,375 A | 12/1995 | Korotky et al. |
| 5,563,732 A | 10/1996 | Erdogan et al. ............ 359/341 |
| 5,692,082 A | 11/1997 | Fukuswhima ................. 385/88 |
| 5,715,263 A * | 2/1998 | Ventrudo et al. ............... 372/6 |
| 5,721,636 A | 2/1998 | Erdogan et al. ................... 3/30 |
| 5,910,852 A | 6/1999 | Fontana et al. |
| 5,933,555 A | 8/1999 | Shen |
| 5,949,804 A | 9/1999 | Okazaki |
| 5,999,544 A | 12/1999 | Peterson |
| 6,240,119 B1 * | 5/2001 | Ventrudo ...................... 372/96 |
| 6,330,257 B1 * | 12/2001 | Major, Jr. et al. ........ 372/29.02 |

FOREIGN PATENT DOCUMENTS

| | | | |
|---|---|---|---|
| EP | 0436343 A1 | 12/1990 | ............ G02B/6/14 |
| EP | 0734105 A3 | 3/1996 | ............ H01S/3/06 |
| EP | 0734105 A2 | 9/1996 | ............ H01S/3/06 |
| EP | 0877265 A1 | 11/1998 | ............ G02B/6/34 |
| JP | 11202263 A * | 7/1999 | |
| JP | 2002131590 A * | 5/2002 | |
| WO | WO 01/082426 A3 * | 11/2001 | |

OTHER PUBLICATIONS

Kim et al: "Coherence–Collapsed 1.3–M Multimode Laser Diode for the Fiber–Optic Gyroscope" Optic letters, Optical Society of America, Washington, US, vol. 20, No. 7, Apr. 1, 1995, pp. 731–733, XP000497433 ISSN: 0146–9592 p. 733, right–hand column, line 1–7; figure 4.

(List continued on next page.)

*Primary Examiner*—Mark Hellner
(74) *Attorney, Agent, or Firm*—Allen, Dyer, Doppelt, Milbrath & Gilchrist, P.A.

(57) ABSTRACT

A semiconductor pump laser uses a depolarzer to depolarize the pump light entering the fiber amplifier. The depolarized light source is useful for reducing polarization dependent gain of fiber amplifiers. The pump laser includes one or more semiconductor, coherence-collapsed laser sources emitting polarized pump outputs, and one or more depolarizers disposed to depolarize the polarized pump output from the lasers. One or more fiber outputs are coupled to the one or more depolarizers to receive depolarized pump light. The depolarizer may include an N×M polarization preserving coupler having N inputs and M outputs, N and M being at least 2, an input to the depolarizer at a first coupler input, an output port from the depolarizer at a first coupler output. A polarization-controlling optical path is coupled between a second coupler output and a second coupler input. A polarization of light exiting the N×M coupler through the second coupler output is substantially orthogonal to a polarization of light entering the N×M coupler through the second coupler input.

52 Claims, 16 Drawing Sheets

OTHER PUBLICATIONS

Yoshihiro et al.: "Cost–effective depolarized diode pump unit designed for C–band flat–gain Raman amplifiers to control EDFA gain profile" OFC. Technical Digest Postconference Edition. Baltimore, MD, Mar. 7–10, 2000, New York, NY: IEEE, US, vol. 4 of 4, Mar. 7, 2000, pp. 106–108, XP002187327 ISBN: 0–7803–5952–6.

*All Fiber In Line Optical Depolarizer*. Alliance Fiber Optic Products Inc.

Wang Jau–Sheng, *Reduction of the Degree of Polarization of Laser Diode With a Fiber Lyot Depolarizer*, Jul. 15$^{th}$ 1999.

Alferness R.C. et al., *Waveguide electro–optic polarization transformer*, Appl. Phys. Lett. 38(9), May 1, 1981, p. 655.

Hillerich B. et al, *Polarization noise in single mode fibres and its reduction by depolarizers*, Optical and Quantum Electronics 15 (1983) p. 281–287.

Shen Paisheng, et al., *New Single–Mode Fiber Polarization Scrambler*, Optical Fiber Technology 3, p. 184–188 (1997), Article No. OF970217.

Shen Paisheng, et al., *Passive fibre depolariser based on incoherent cascaded fibre–rings*, Electronics Letters Sep. 3$^{rd}$ 1998, vol. 34 No. 18 p. 1777.

Shen Paisheng, et al., *Passive single–mode fiber depolarizer*, Applied Optics, vol. 38, No. 9, Mar. 20, 1999, p. 1686.

Cooper P.R., Technical note, *All fibre Lyot depolarizer*, Optics and Laser Technology, Vol 18. No. 2 Apr. 1986.

Mochizuki Kiyofumi, *Degree of polarization in jointed fibers: the Lyot depolarizer*, Applied Optics vol. 23, No. 19, Oct. 1$^{st}$, 1984 p. 3284.

Burns William K., *Degree of Polarization in the Lyot Depolarizer*, Journal of Lightwave Technology, vol. LT–1, No. 3 Sep. 1983.

Bohm Konrad, et al., *Performance of Lyot Depolarizers with Birefringent Single–Mode Fibers*, Journal of Lightwave Technology, vol. Lt–1 No. 1, Mar. 1983, p. 71.

Shen Benson Paisheng, et al., *New passive fiber depolarizer based on cascaded all–fiber recirculating rings*, SPIE Conference on Optical Fiber Communication, Taipei, Taiwan, SPIE vol. 3420 Jul. 1998, p. 297.

Emori Yoshihiro, *Cost–effective depolarized diode pump unit designed for C–band flat–gain Raman amplifiers to control EDFA gain profile*, Paper FF4, OFC. 2000, Mar. 10, 2000, Baltimore, USA.

Wang J.S., *Reduction of the Degree of Polarization of a Laser Diode with a Fiber Lyot Depolarizer*, IEEE Photonics Technology Letters, vol. 11 No. 11. Nov. 1999, p1449.

Shen Paisheng, et al., *Tunable singlemode fibre depolariser*, Electronics Letters Jun. 5$^{th}$, 1997, vol. 33, No. 12.

Hubbars David, *Elimination of Polarization Dependent Loss from Insertion Loss Measurements using the All–Fiber in Line Optical Depolarizer*.

* cited by examiner

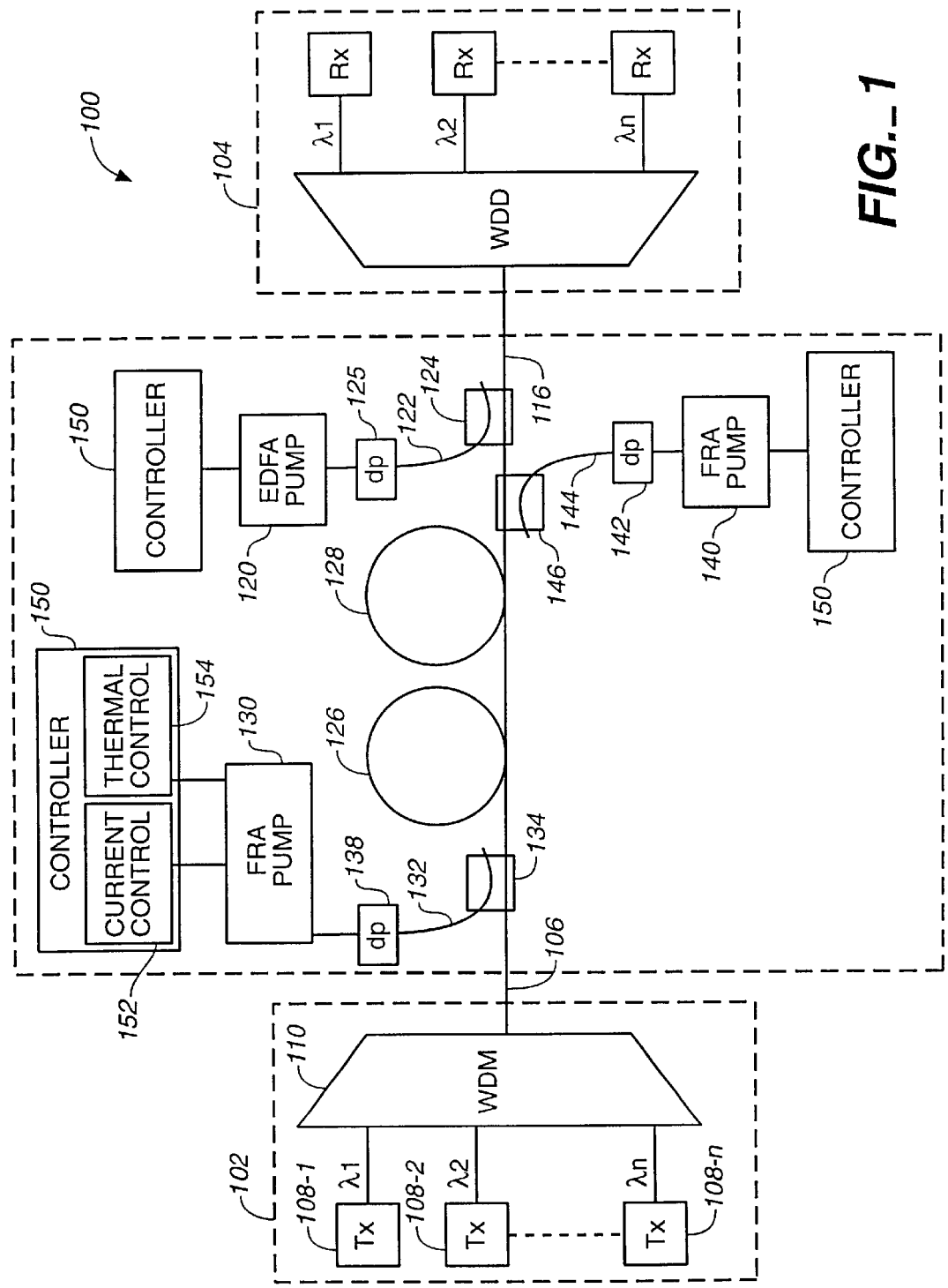
FIG._1

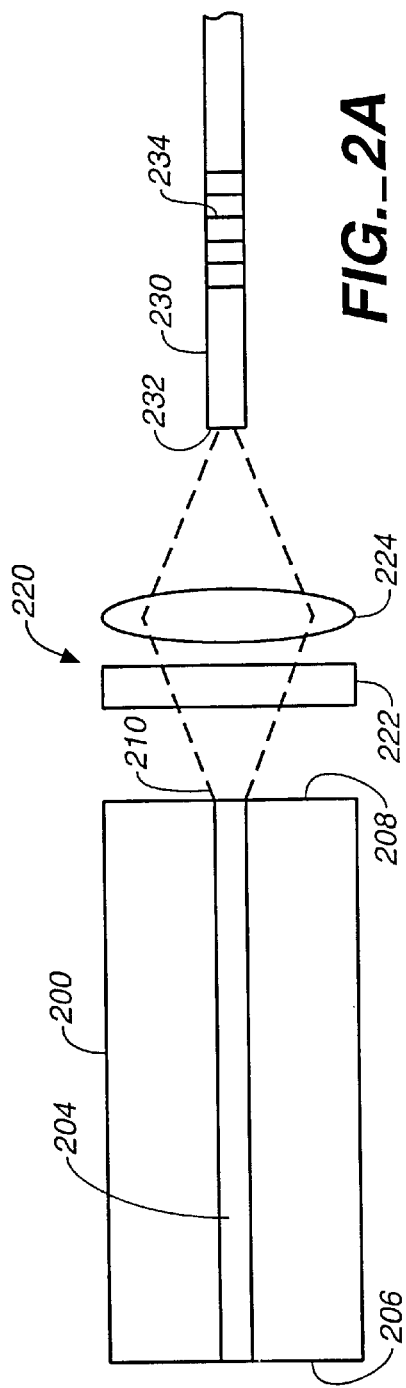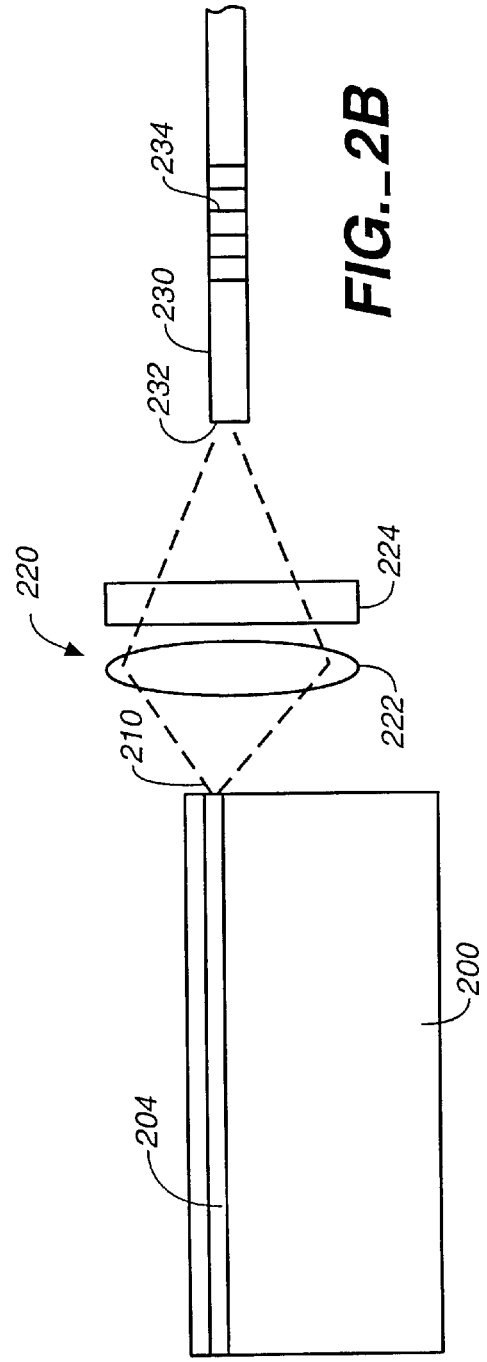

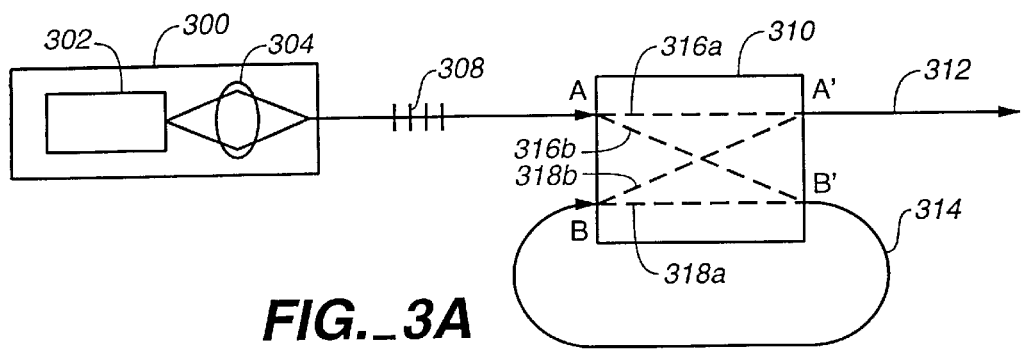
FIG._3A
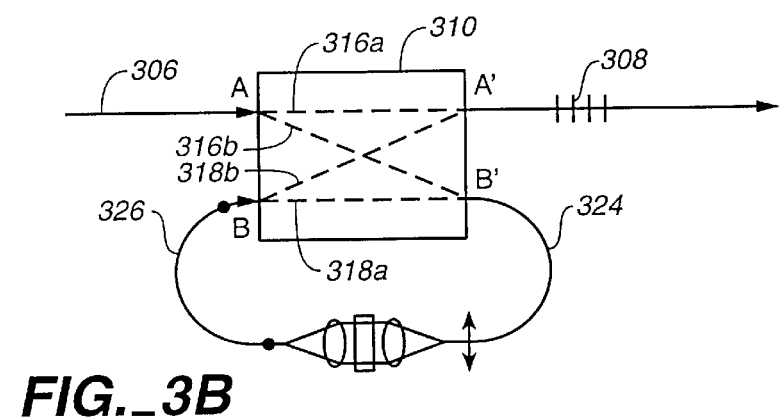
FIG._3B
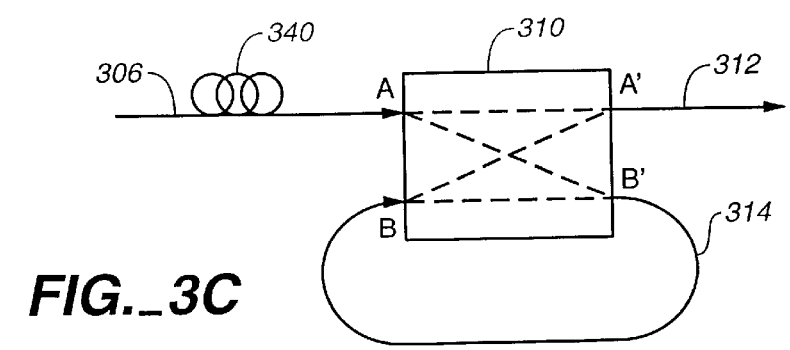
FIG._3C

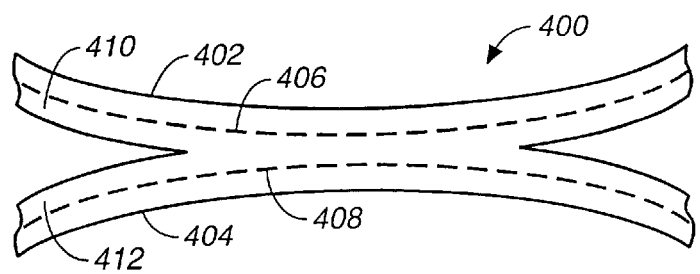
FIG._4A
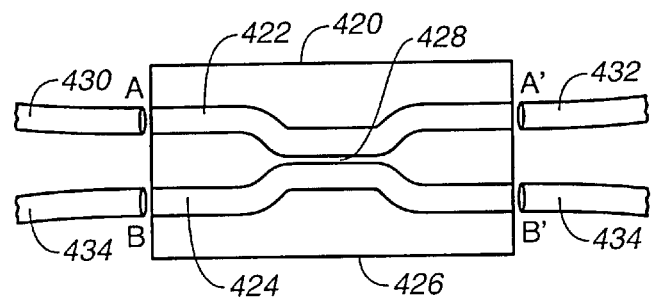
FIG._4B
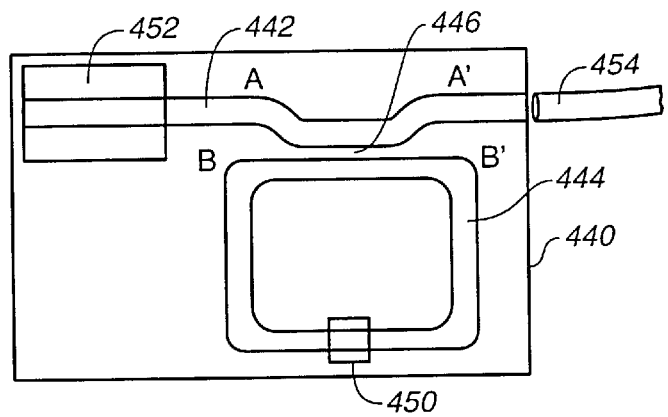
FIG._4C
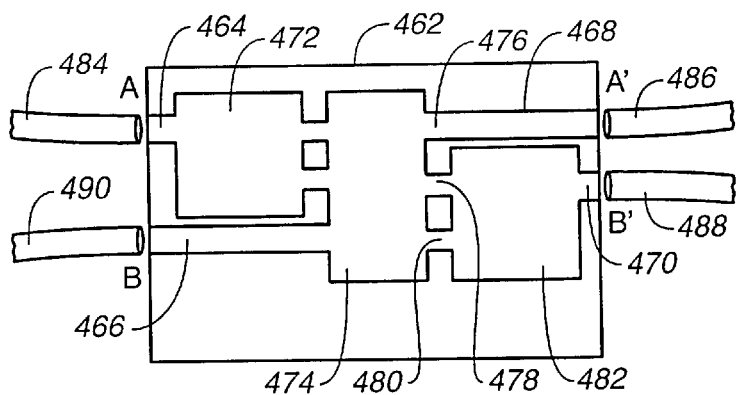
FIG._4D

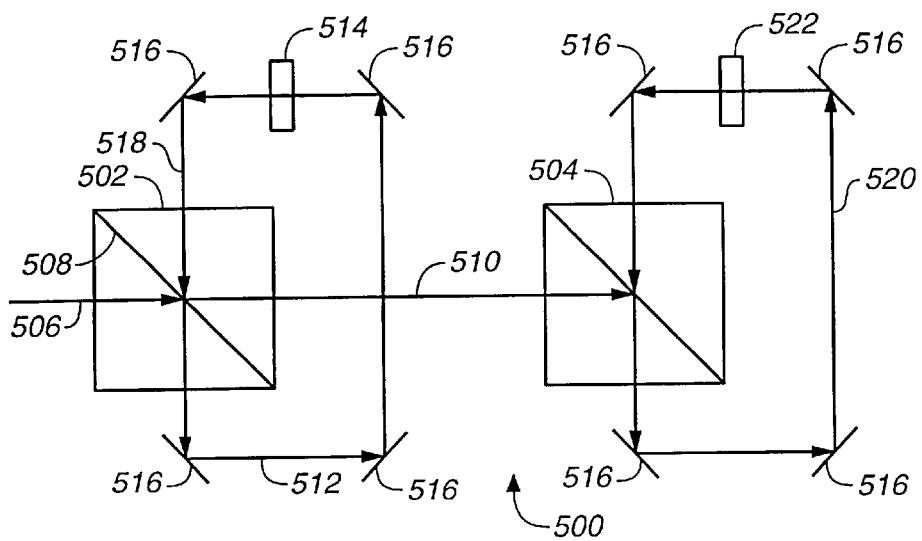
FIG._5A
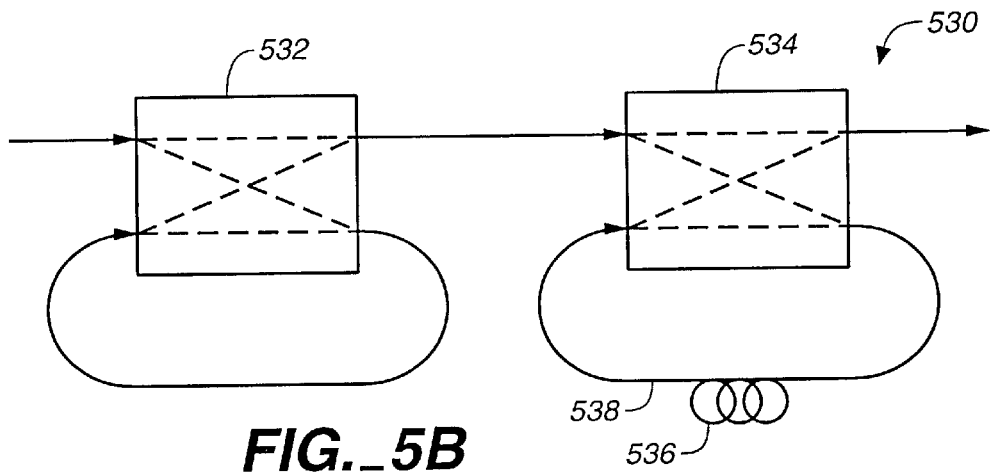
FIG._5B
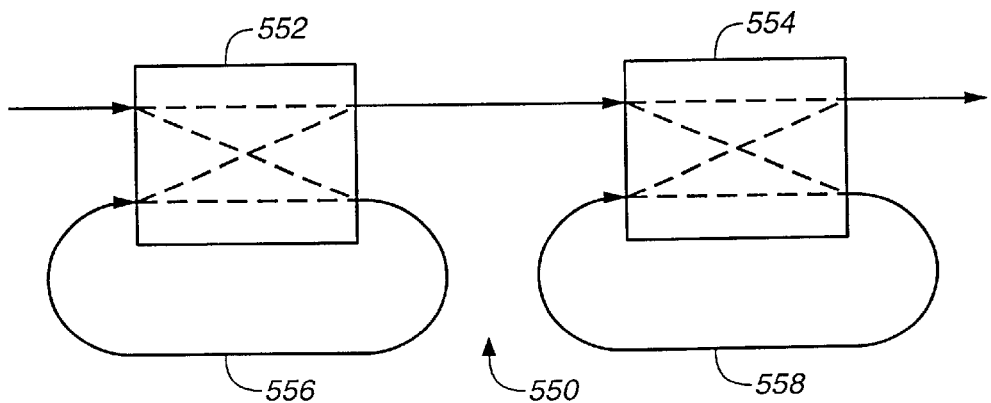
FIG._5C

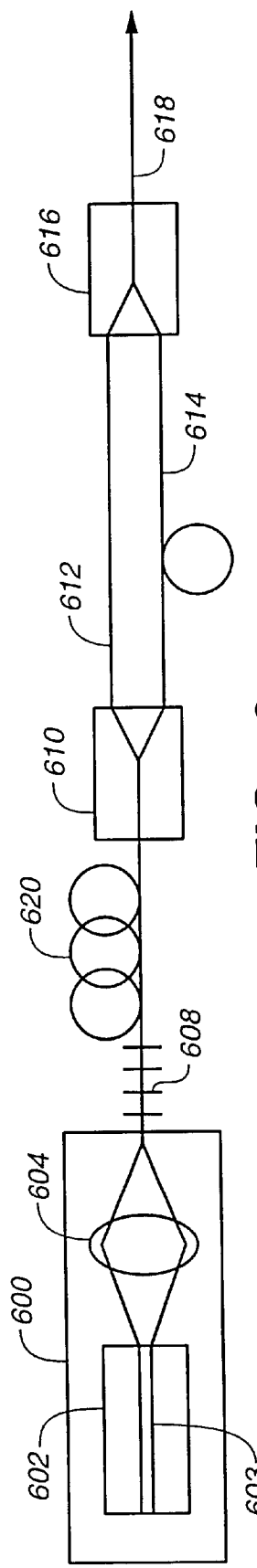
FIG._6
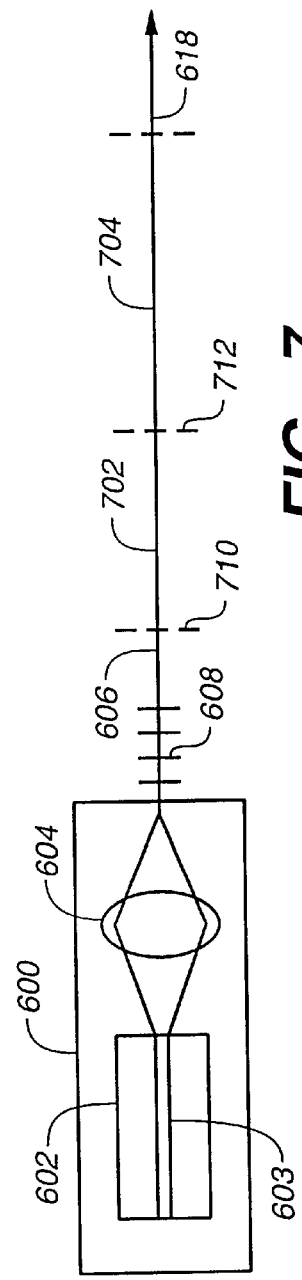
FIG._7

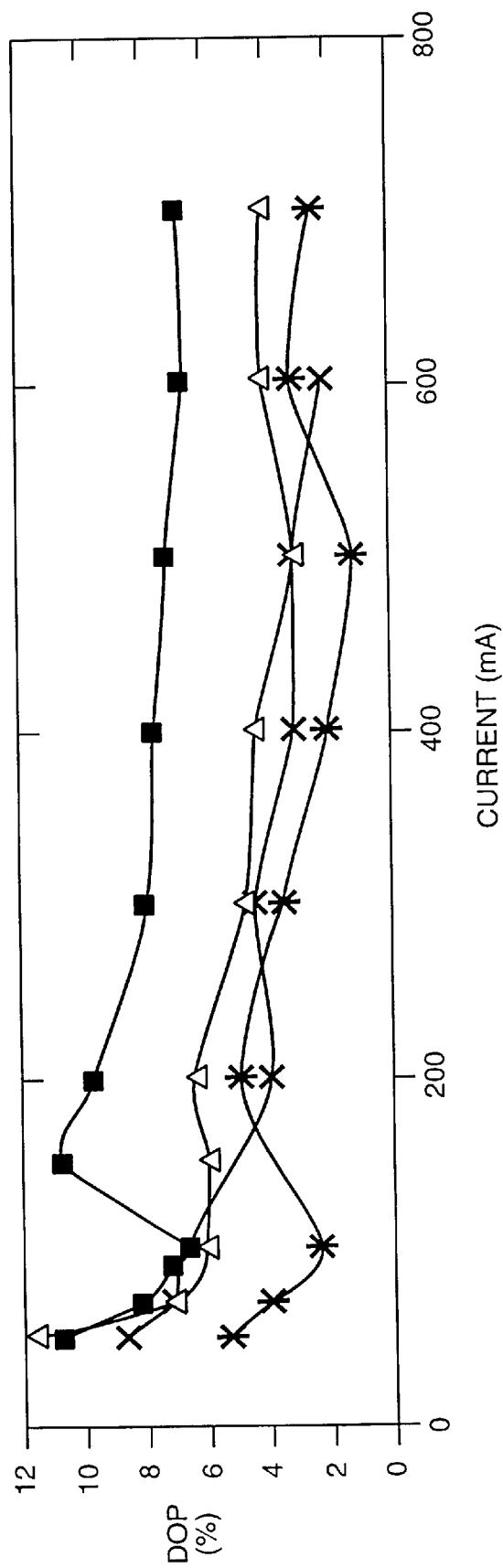
FIG._8

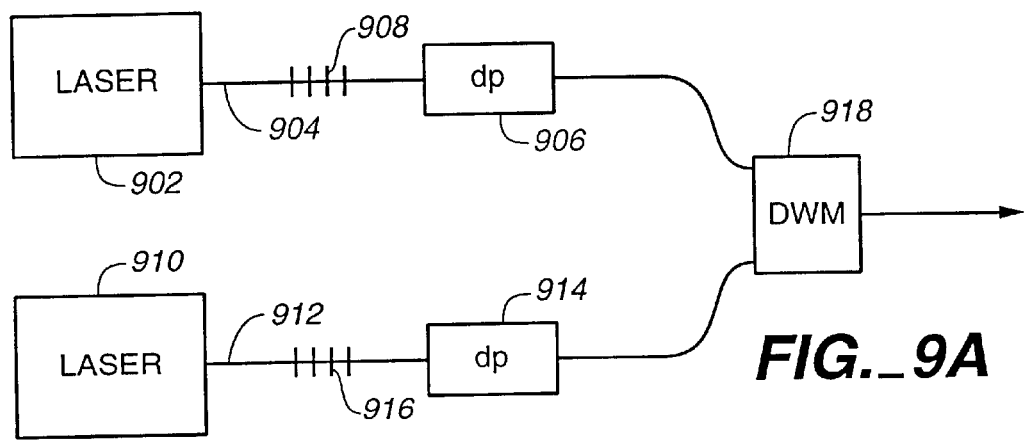
FIG._9A
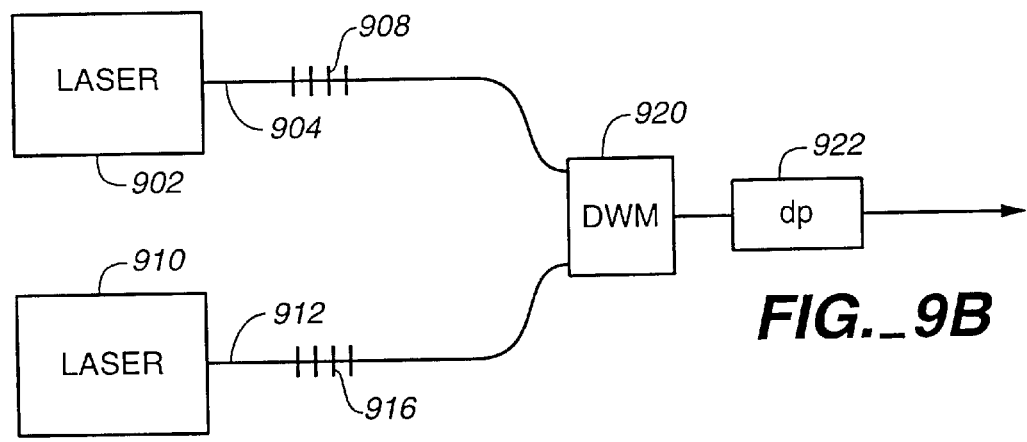
FIG._9B

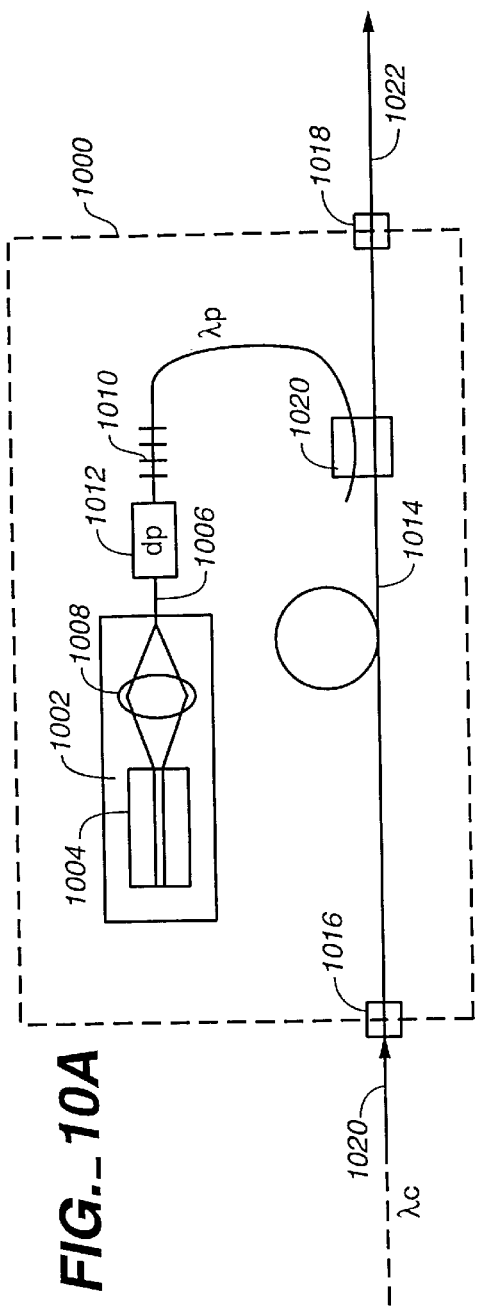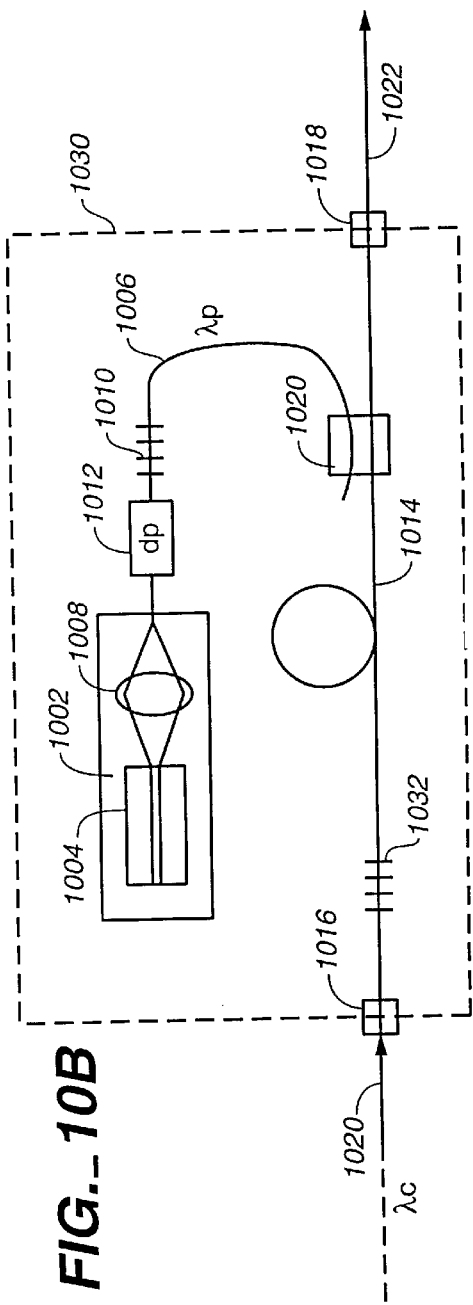

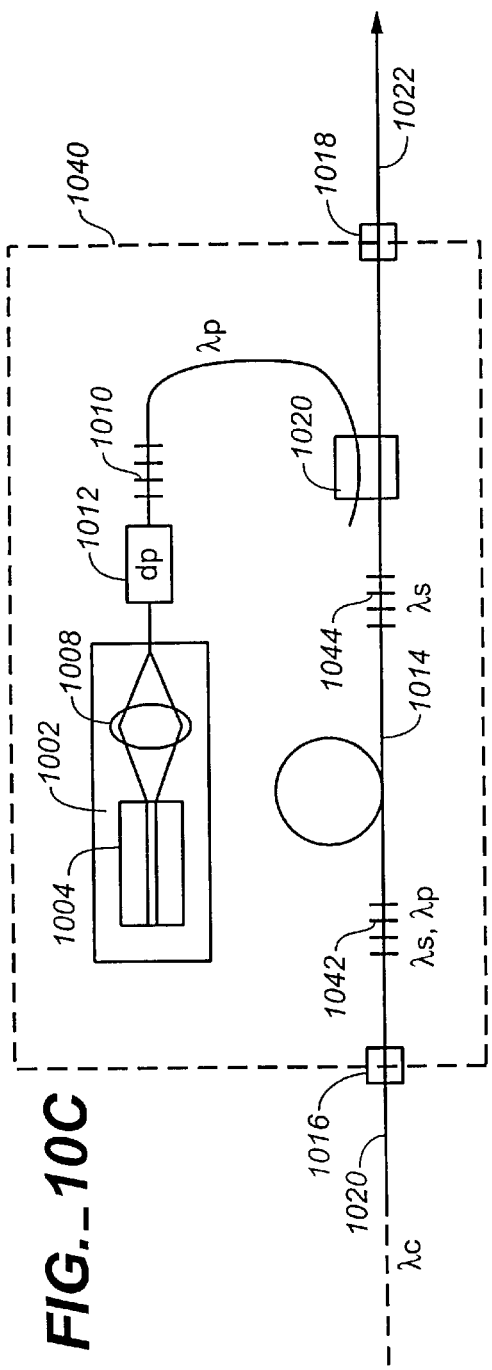
FIG._10C
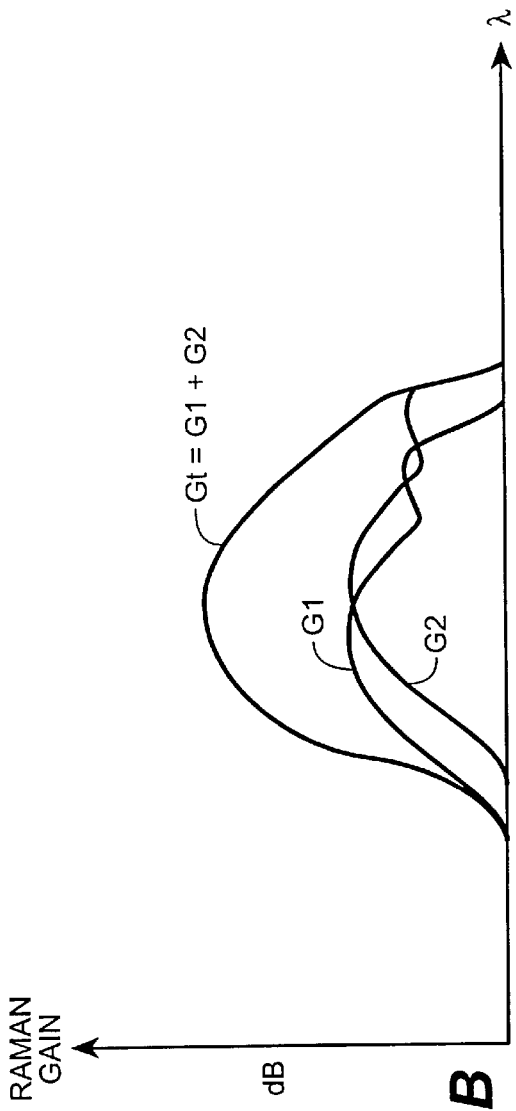
FIG._12B

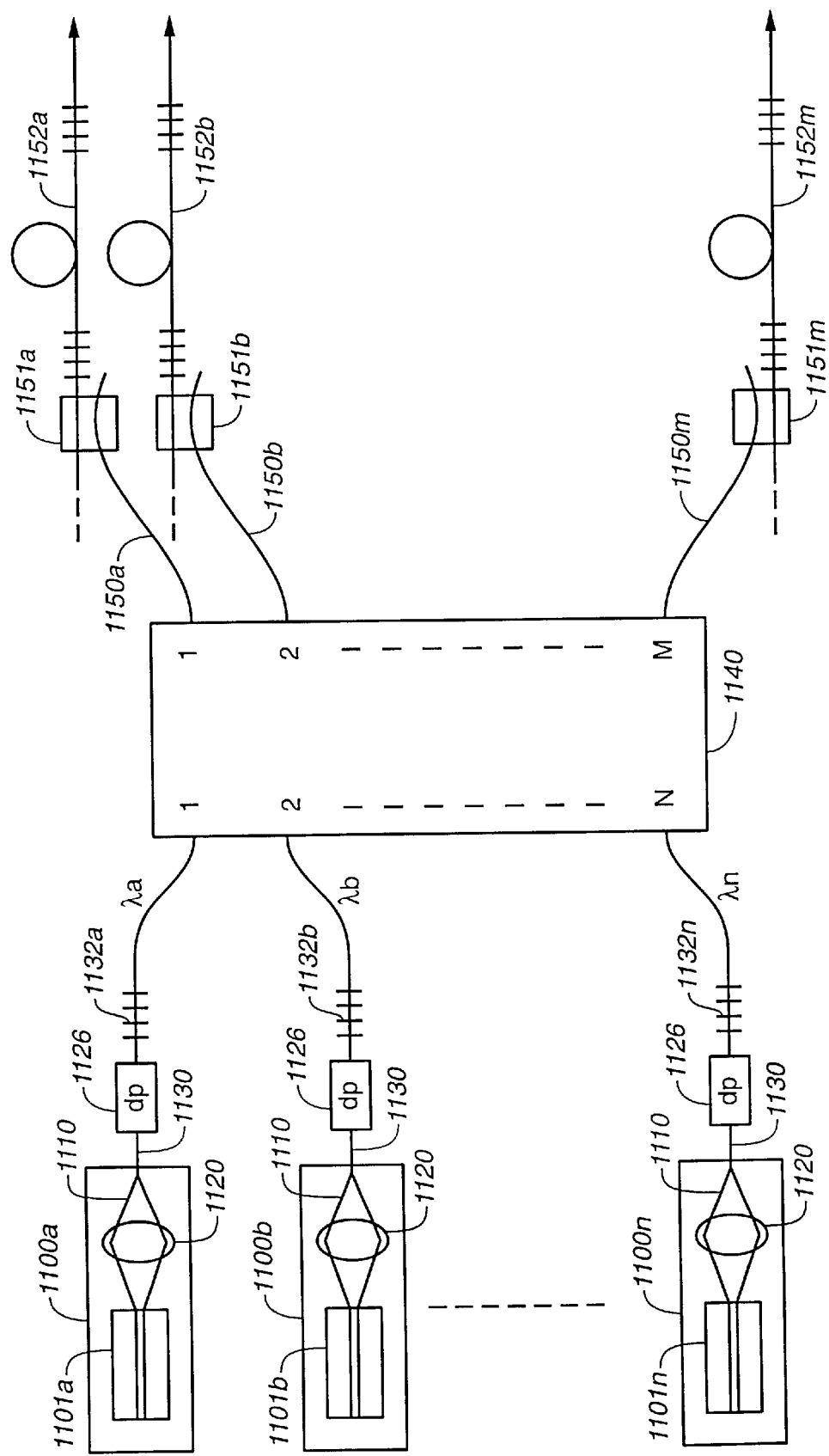
FIG._11

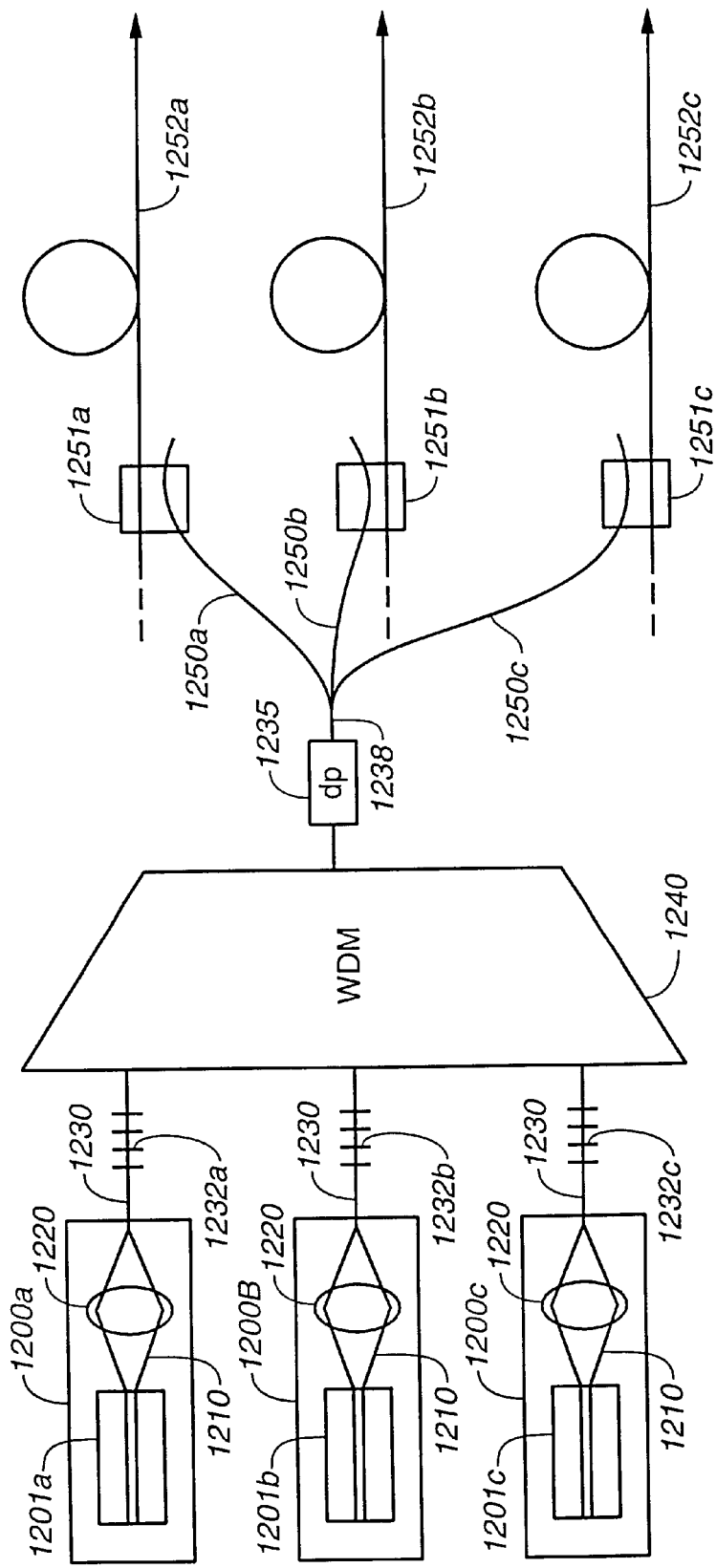
FIG._12A

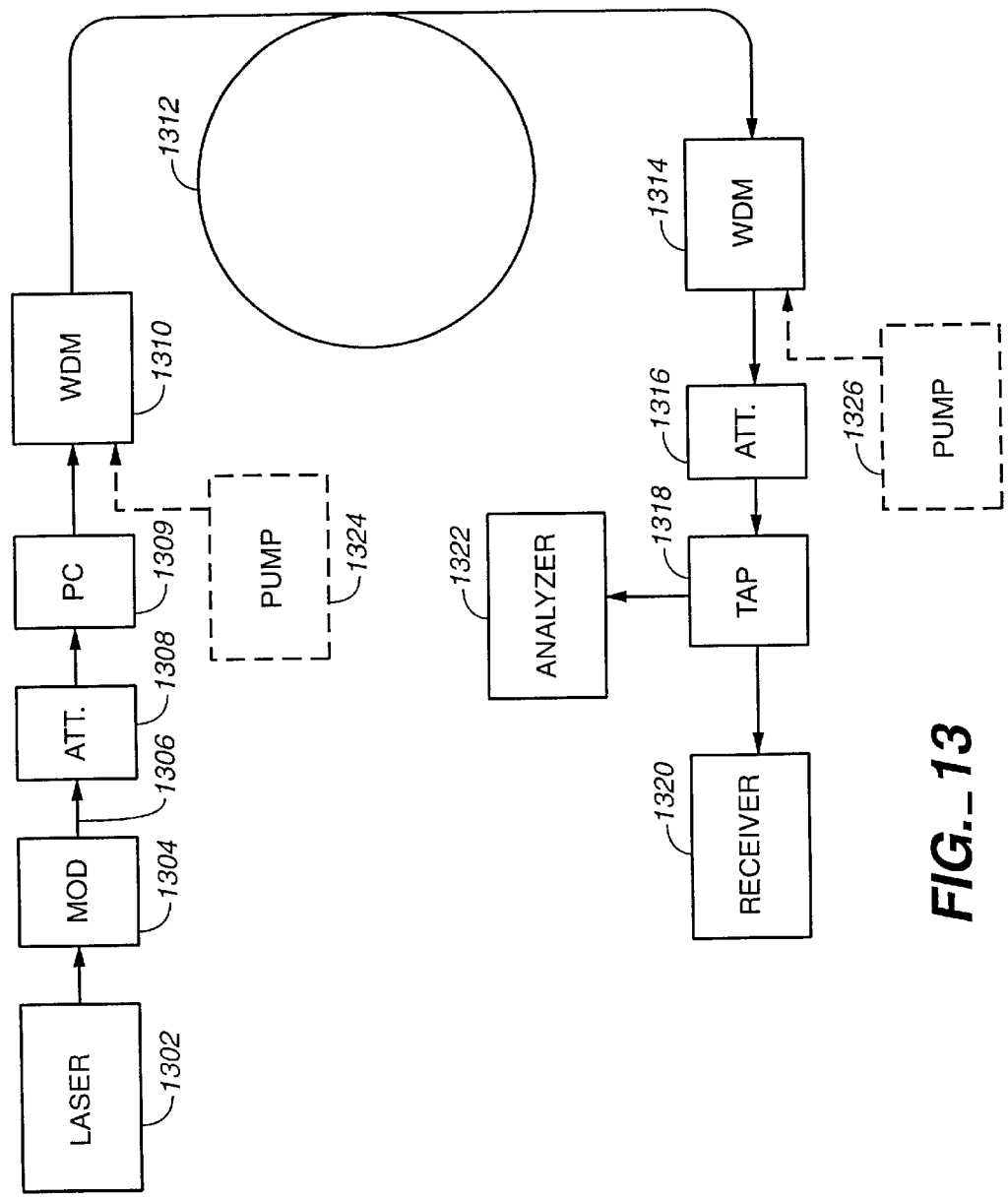
FIG._13

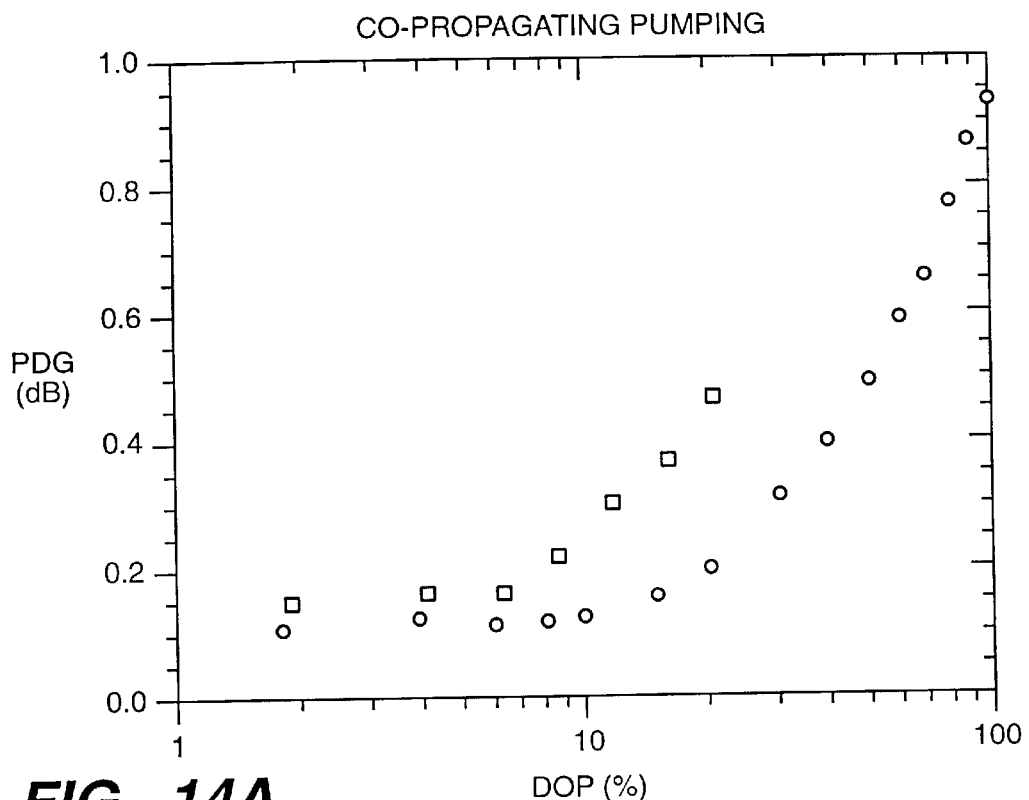
FIG._14A
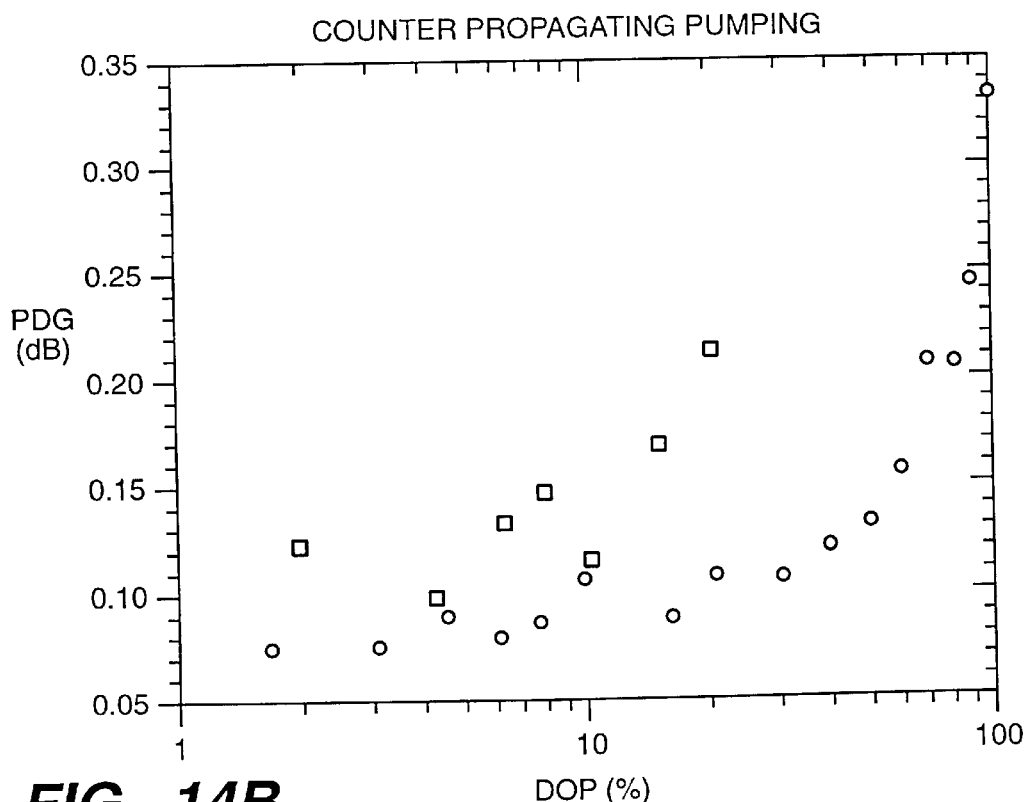
FIG._14B

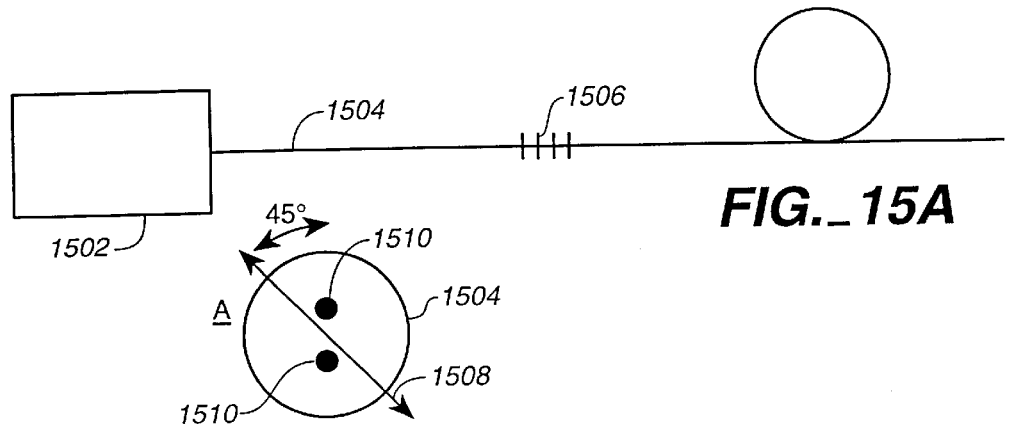
FIG._15A
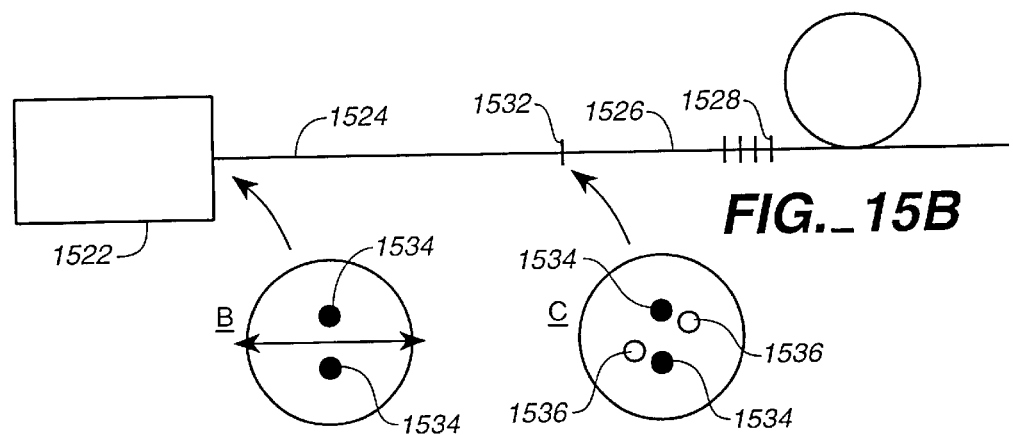
FIG._15B
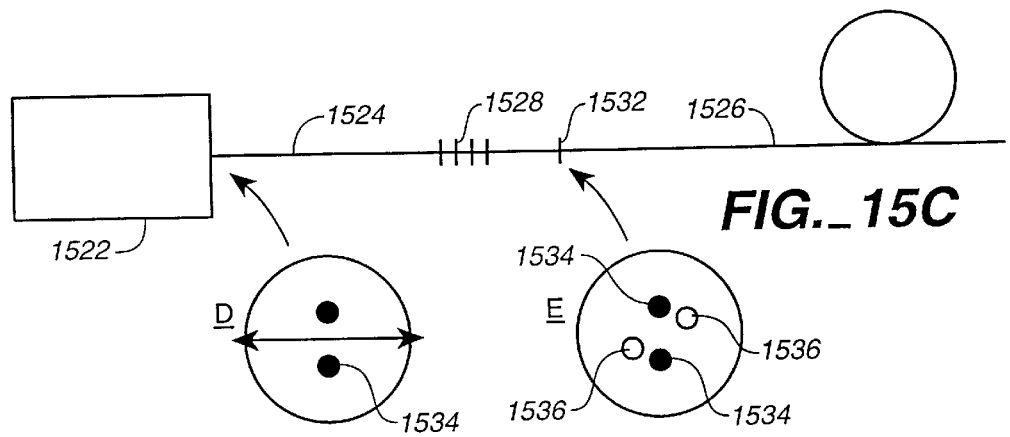
FIG._15C

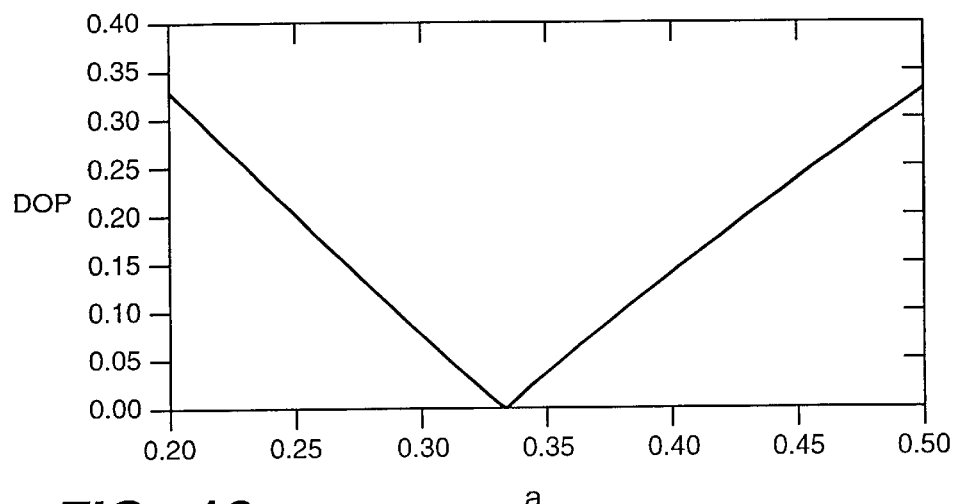
FIG._16
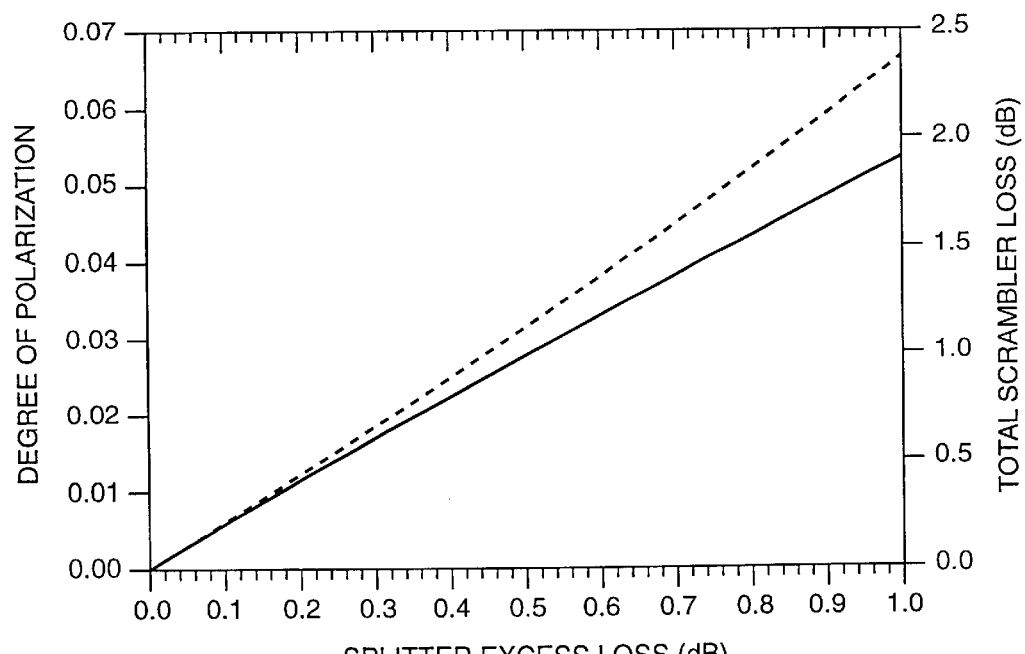
FIG._17

DEPOLARIZED SEMICONDUCTOR LASER SOURCES

FIELD OF THE INVENTION

Generally, the present invention relates to fiber optic communication systems, and particularly to laser sources for pumping fiber amplifiers.

BACKGROUND

In many optical systems, such as pumps in optical communication systems, fiber gyros, control channels in optical amplifiers, sensors, and inteferometers, it is desirable to have a depolarized source to reduce polarization effects. For example, optical communications systems are increasingly using fiber systems that include fiber amplifiers for amplifying the optical communications signal. In particular, Raman amplifiers are becoming increasingly used for distributed or remote amplification. These amplifiers are useful because they may be implemented in the normal fiber that carries the optical communications signal, and do not require the insertion of a special type of fiber, as is the case with a rare earth-doped fiber amplifier. As a result, systems may be designed where amplification occurs in the transmission link itself, allowing greater transmission distances between amplifiers, higher receiver sensitivities, and lower transmission powers. Lower transmission powers have the added advantage of reducing nonlinear effects in the fiber. Furthermore, the wavelength at which the fiber Raman amplifier operates is determined by the wavelength of the pump light, unlike a rare earth-doped fiber amplifier whose gain bandwidth is limited by the rare earth species doped in the fiber. Raman amplification is also a very low noise process, limited primarily at low powers by pump noise and quantum noise effects.

One particular concern with Raman amplification is the polarization dependence of the amplification process. The Raman gain coefficient when the pump light is polarized parallel to the signal polarization is about an order of magnitude greater than when the pump polarization is orthogonal to the signal polarization.

A long-haul single mode optical fiber is usually non-polarization preserving due to its lower cost and superior performance compared to polarization maintaining fiber. Therefore, the polarizations of the pump and signal to change relative to each other as they propagate along the length of the fiber amplifier. In practice, Raman amplifiers are long, up to several kilometers in length, which permits sufficient variation in the relative polarizations of the signal and the pump that the polarization-dependent gain effect is averaged out.

However, there remains a possibility that the pump and signal maintain the same relative polarizations for a significant length of the fiber amplifier. In such situations, the amplifier gain may be strongly dependent on the relative polarizations of the signal and the pump. This leads to uncertainty in amplifier performance, which results in increased errors in signal detection or increased system margin requirements.

Therefore, there is a need for fiber amplifier systems that have a reduced dependency on the relative polarizations of the signal and pump beams, so that amplifier performance can be more predictable and reliable.

SUMMARY OF THE INVENTION

A semiconductor pump laser uses a depolarizer to depolarize the pump light entering the fiber amplifier. The depolarized light source is useful for reducing polarization dependent gain of fiber amplifiers.

In one embodiment of the invention, a fiber communications system includes a coherence-collapsed laser source including a semiconductor laser element emitting a polarized output; and a depolarizer coupled via a polarization maintaining path to the laser element to receive the polarized output and configured to depolarize the polarized output from the laser element to produce a depolarized laser signal.

In another embodiment of the invention, an optical fiber system includes coherence collapsed light emitting means for emitting polarized light and light depolarizing means for depolarizing the polarized light received from the light emitting means via a polarization preserving path. Fiber amplifying means are coupled to receive depolarized light from the light depolarizing means.

Another embodiment of the invention includes a pump light source for pumping a fiber amplifier. The pump light source includes at least two coherence collapsed lasers emitting pump light from at least two respective outputs and at least one depolarizer disposed to depolarize pump light from the at least two coherence collapsed lasers. A combiner combines light from the at least two coherence collapsed lasers, the combiner having at least one output fiber couplable to one or more active fiber devices.

Another embodiment of the invention is directed to a laser source including a semiconductor laser element emitting a polarized output. A wavelength selective reflector is disposed to feed a portion of the output back to the laser element, whereby a coherence length of the polarized output is reduced. A depolarizer is disposed to depolarize the output from the laser element.

Another embodiment of the invention is directed to a laser system that includes a laser source having a semiconductor laser element emitting a polarized output having a coherence length of less than 30 cm and a depolarizer disposed to depolarize the polarized output from the laser element.

Another embodiment of the invention is directed to a laser system that includes a semiconductor laser element emitting a polarized output, and a polarization maintaining fiber coupled to receive the polarized output from the semiconductor laser element, a polarization axis of the polarization maintaining fiber being oriented at approximately 45° relative to a polarization direction of the polarized output from the laser element.

Another embodiment of the invention is directed to a laser system that includes a semiconductor laser element producing an output signal. The laser element is operable in a first operating mode with the output signal having a first coherence length and in a second operating mode with the output signal having a second coherence length less than the first coherence length. A depolarizer is disposed on a light path from the laser element such that light having the second coherence length is substantially depolarized while light having the first coherence length is substantially unchanged in degree of polarization.

Another embodiment of the invention is a fiber depolarizer that includes an N×M polarization preserving coupler having N inputs and M outputs, N and M being at least 2; an input to the depolarizer at a first coupler input and output port from the depolarizer at a first coupler output. A polarization-controlling optical path is coupled between a second coupler output and a second coupler input. A polarization of light exiting the N×M coupler through the second coupler output is substantially orthogonal to a polarization of light entering the N×M coupler through the second coupler input.

The above summary of the present invention is not intended to describe each illustrated embodiment or every implementation of the present invention. Other objects and attainments, together with a fuller understanding of the invention will become apparent and appreciated by referring to the following description and claims taken in conjunction with the accompanying drawings.

BRIEF DESCRIPTION OF THE DRAWINGS

The invention may be more completely understood in consideration of the following detailed description of various embodiments of the invention in connection with the accompanying drawings, in which:

FIG. 1 schematically illustrates an embodiment of an optical fiber communications system;

FIGS. 2A and 2B schematically illustrate an arrangement for coupling light from a semiconductor gain element to a fiber having a fiber grating according to an embodiment of the present invention;

FIGS. 3A–3C schematically illustrate different embodiments of a feedback depolarizer according to the present invention;

FIGS. 4A–4D schematically illustrate different embodiments of coupler used in a feedback type depolarizer, according to the present invention;

FIGS. 5A–5C schematically illustrate different embodiments of dual-stage feedback depolarizer, according to the present invention;

FIG. 6 schematically illustrates a depolarized light source using a dual-arm depolarizer according to the present invention;

FIG. 7 schematically illustrates a depolarized light source using a Lyot depolarizer according to the present invention;

FIG. 8 illustrates a graph of degree of polarization plotted against diode laser current for four different diode lasers, using a Lyot depolarizer;

FIGS. 9A and 9B schematically illustrate different embodiments of depolarized light sources using multiple lasers, according to the present invention;

FIGS. 10A–10C schematically illustrate different embodiments of a discrete Raman Fiber amplifier according to the present invention;

FIG. 11 schematically illustrates an embodiment of an optical fiber system having multiple depolarized lasers according to the present invention.

FIG. 12A schematically illustrates an embodiment of an optical fiber system having multiple depolarized lasers according to the present invention;

FIG. 12B illustrates an example of a pumping wavelength scheme for a Raman gain device using multiple pump sources;

FIG. 13 schematically illustrates an experimental setup for measuring polarization dependent gain of a fiber amplifier;

FIGS. 14A and 14B shows graph relating polarization dependent gain to the degree of polarization of the amplifier pump, for co-propagating and counter-propagating configurations respectively;

FIGS. 15A–15C schematically illustrate different embodiments of a laser source depolarized using a Lyot depolarizer;

FIG. 16 illustrates a graph showing Degree of Polarization plotted against splitting ratio in a feedback depolarizer according to an embodiment of the present invention; and FIG. 17 illustrates a graph of Degree of Polarization and total depolarizer loss plotted against the excess loss of the splitter in a feedback depolarizer.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to fiber amplifier pump lasers, and is believed to be particularly applicable to pump lasers for Raman-based amplifiers.

One concern with fiber amplification, particularly with fiber Raman amplification is the polarization dependence of the gain. The Raman gain coefficients are about an order of magnitude different depending on the relative polarizations of the pump beam and the signal being amplified. There is also a polarization dependent effect in erbium-doped fiber amplifiers (EDFAs), albeit smaller than the effect in Raman amplifiers. The polarization effect in an EDFA is believed to be lowest in the C-band, but is more pronounced for L-band EDFAs. Thus, as communications systems add more channels and extend further into the L-band, polarization dependent gain will become an increasing problems for EDFAs.

In practice, the polarizations of the pump and signal beams randomly change over a long length of fiber, and typically average out over a sufficiently long length. However, it is possible that the pump and signal maintain the same relative polarization for a significant length of fiber, inducing some polarization dependence to the gain. This could happen, for example, if a significant stretch of fiber has a residual birefringence and the pump and signal happen to launch into this stretch of fiber in a linear polarization state aligned to the principle axis of the birefringence. In such a case, the fiber acts as a polarization maintaining fiber, keeping the polarization of the pump and signal aligned for the length of the residual birefringence as long as its principle axis angle does not abruptly change. There are many other examples of birefringence in the fiber that cause polarization of the pump and signal to remain in alignment, for both co-propagating and counter-propagating Raman pumping configurations. The dispersion of the birefringence may eventually cause the polarization of the pump and signal wavelengths to walk off from each other.

An experimental system used for measuring the polarization dependent gain (PDG) of a fiber Raman amplifier is illustrated in FIG. 13. A signal from a laser 1302 operating at about 1555 nm is modulated in a modulator 1304 with information at a rate of approximately 2.5 Gb/s. The modulated output 1306 passes through an attenuator 1308 for amplitude control. The output from the attenuator 1308 is passed through a polarization controller 1309 and a wavelength division multiplexer (WDM) 1310, whose function is described below. The output from the WDM 1310 is passed through an 86 km length of SMF28 non-polarization preserving amplifier fiber 1312. The output from the amplifier fiber 1312 is passed through a second WDM 1314 and a second attenuator 1316 to a tap which splits the signal into two components, directed to a receiver 1320 and an analyzer 1322. The receiver 1320 is used to receive the signal and check that the bit error rate (BER) in the received signal is at an acceptably low level. The analyzer 1322, which may be a Hewlett Packard HP 8509, is used to check the power and polarization of the received signal.

A pump laser was placed in one of two positions. The first position 1324, shown in dashed lines, is a co-propagating position, in which the pump beam is combined in the first WDM 1310 with the modulated signal and co-propagates with the signal through the amplifier fiber 1312. The second position 1326, also shown in dashed lines, is a counter-propagating position, in which the pump light is coupled into the fiber 1312 through the second WDM 1314 and propagates through the amplifier fiber 1312 in the direction opposite to the signal.

The Raman amplifier gain was measured using the above described experimental set-up, for a pump source operating at 1455 nm and having an adjustable degree of polarization (DoP). A high DoP indicates that the pump source is highly polarized. For example, the light emitted by a semiconductor laser has a DoP close to 100%. A low DoP indicates that the light is unpolarized. The DoP of the pump source was set and the Raman amplifier gain was measured over many different input signal polarizations by sweeping the polarization of the signal over the entire Poincare sphere using the polarization controller. The polarization dependent gain (PDG) was calculated by subtracting the minimum gain from the maximum gain. The PDG for a co-propagating configuration is shown in FIG. 14A and for a counter-propagating configuration are shown in FIG. 14B. Measurements were made at two different levels of Raman gain for each configuration. Results obtained with a 250 mW pump level, corresponding to a Raman gain of 8.45 dB, are shown in open squares. Results obtained with a pump level of 100 mW, corresponding to a Raman gain of 3.28 dB, are shown in open circles. For both configurations, the amount of PDG was highest for the most polarized source, and fell to about 0.05 dB for the least polarized source in the counter-propagating configuration. Furthermore, the PDG was greater in the co-propagating configuration than in the counter-propagating configuration for a specific level of DoP.

The PDG may induce some uncertainty in amplifier performance, for example reducing gain, SNR and signal at the receiver, introducing errors or necessitating an increase in the required system margins. Therefore, it is desirable to have a pump source whose output is not polarized, or whose polarization is scrambled. A pump source whose output is not polarized is a source whose polarization is rapidly changing, in timescales on the order of 1/linewidth of the source. A polarization scrambled source is a polarized source whose output is scanned over all polarization states at a slower rate than 1/linewidth of the source. As long as the polarization of the pump changes at a rate faster than the averaging time of the fiber amplifier, then the fiber Raman amplifier shows little polarization dependence. The averaging time for a fiber Raman amplifier in a co-propagating configuration is of the order of 10 ns, depending on the fiber used, while the averaging time in the counter-propagating direction the averaging time is on the order of 10 $\mu$s. The longer averaging time of the counter-propagating configuration explains why the PDG shown in FIG. 14 is less for the counter-propagating than for the co-propagating geometry. Furthermore, a counter-propagating Raman amplifier configuration typically results in a larger increase in the received signal to noise ratio (S/N) than a co-propagating configuration.

One method of overcoming the problems of PDG is to depolarize the amplifier pump light using a depolarizer. FIG. 1 shows an example of a fiber-based optical communications system 100 having a transmitter unit 102 and a receiver unit 104 coupled by a fiber communications channel 106. The system may be based on the use of a single wavelength, or may be based on the use of multiple wavelengths of light. A common approach to using multiple wavelengths of light, referred to as WDM, is to multiplex signals at various wavelengths into a single multiplexed signal at a transmitter end and to demultiplex the various wavelength components at the receiver end. Dense WDM (DWDM) systems may also be used. As used herein, "WDM" includes DWDM.

The communications system 100 may be a WDM system, and the transmitter unit 102 may include a number of semiconductor laser transmitters 108-1,108-2, . . . 108-n operating at different wavelengths $\lambda 1, \lambda 2, \ldots, \lambda n$ respectively. The laser transmitters typically operate at a wavelength of around 1550 nm, although communications at other wavelengths are also possible. The light output from each laser transmitter 108-1, 108-2, . . . 108-n is combined in a wavelength division multiplexer (WDM) 110 for transmission through the fiber channel 106.

After propagating through the fiber channel 106, the multiplexed optical signal is received at the receiver unit 104. The light is split into its different wavelength components $\lambda 1, \lambda 2, \ldots, \lambda n$ in a wavelength division demultiplexer (WDD) 112, and each wavelength component is detected by a respective receiver 114-1, 114-2, . . . , 114-n. The fiber channel 106 may include multiple fibers, although only a single fiber is considered in the following description, for clarity.

Transmission losses within a fiber result in a reduction in the signal strength as the signal propagates between the transmitter 102 and the receiver 104. Optical amplifiers are typically positioned along the fiber so that the signal, when it reaches the receiver 104, is sufficiently strong to reduce errors to an acceptable level. This can be accomplished by adding amplifiers in series along communications fiber 106 until the destination is reached. Two types of amplifier are contemplated in the figure. One type of amplifier is based on the use of a rare-earth doped fiber: erbium doped fiber amplifiers (EDFAs) are finding increasing use in fiber communications for amplifying optical signals at around 1550 nm. The fiber communications channel 106 may include one or more EDFAs. The figure shows one EDFA section 116. The EDFA section 116 is pumped with an EDFA pump 120, typically a semiconductor laser operating at a wavelength of around 980 nm. The optical power output from the pump 120 is coupled to the EDFA 116 through a coupling fiber 122 and a fiber-fiber coupler 124. The output from the pump 120 may be passed through a depolarizer 125, labeled "dp", before being coupled into the EDFA 116.

Another type of amplifier is a fiber Raman amplifier (FRA), which uses Raman gain to amplify the optical signal. A first FRA section 126 may be positioned close to the output from the transmitter 102 in order to boost the communications signal as it enters the communications fiber 106. The first FRA 126 is pumped with an FRA pump 130. Where the optical communication signal has a wavelength of about 1550 nm, the FRA pump 130 is typically a semiconductor laser operating at a wavelength of around 1455 nm. The actual pump wavelength depends on the wavelength to be amplified and on the Stokes shift of the fiber, which is determined by the type of fiber used for the FRA.

The FRA pump light produced by the FRA pump 130 is typically coupled to the FRA 126 through a coupling fiber 132 and a fiber-fiber WDM coupler 134, although other coupling schemes may also be used. A depolarizer 138 may be positioned at the output of the pump laser 130 in order to depolarize the pump light coupled through the coupling fiber 132 to the first FRA 126. In the particular configuration illustrated, the pump light is directed along the FRA 126 in the same direction as the communication signal from the transmitter 102. This configuration is referred to as a co-propagating configuration.

A second FRA 128 may be positioned as a preamplifier before the EDFA 116. The second FRA 128 is pumped by a second pump laser 140. The output from the pump laser 140 may be coupled to the second FRA 128 through a depolarizer 142, coupling fiber 144 and WDM coupler 146. The second FRA 128 may be configured so that the pump light from the pump laser 140 propagates through the second FRA 128 in a direction opposite that of the communications signal. Such a configuration is referred as a counter-propagating configuration.

The pump lasers 120, 130 and 140 may each be attached to a controller 150. The controller 150 may include a power supply 152, providing and controlling current directed to the pump lasers 120 and 130. The controller 150 may also include a thermal controller 154 to stabilize the operating temperature of the pump lasers 120 and 130. For example, the pump lasers 25 may each include a semiconductor laser element thermally coupled to a thermoelectric cooler that is operated by the thermal controller 154, to cool the laser element to a specific operating temperature.

It will be appreciated that the numbers and types of amplifiers disposed along a fiber communications link are dependent on the particular needs of that link. Accordingly, the numbers and types of amplifiers may differ from that shown in FIG. 1. For example, a fiber communications link may include a number of amplifier units 105 along its length, where each amplifier unit 105 includes a co-propagating FRA, a counter-propagating FRA and an EDFA , or some other combination of amplifiers. The number of amplifier units 105 may be increased or decreased as necessary to obtain an acceptable bit error rate (BER) at the receiver.

The output power from the pump laser should be sufficient to raise the gain of the fiber amplifier to the desired level. The higher the output power of a particular pump laser, the higher the amplifier gain becomes, thus reducing the number of fiber amplifiers required to cover a fiber link of a given length. Furthermore, it is desirable that the spectrum and output power of the pump laser are stable, in order to maintain constant gain and gain spectrum.

One particular problem of pumping fiber amplifiers, however, is the presence of nonlinear parasitic processes, such as stimulated Brillouin scattering (SBS). This occurs when the power level of the pump light within a narrow linewidth becomes too high. For example, the SBS threshold in a fiber for light from a single longitudinal mode distributed feedback (DFB) semiconductor laser, typically having a bandwidth of around 20 MHz, is generally in the range of 5 mW to 10 mW. These low SBS thresholds effectively cap the pump power deliverable from available sources, including single mode lasers, master oscillator/power amplifier (MOPA) systems, and even multi-longitudinal mode lasers, having a spectral intensity greater than about 10 mW per 20 MHz. Thus the requirement for high pump power conflicts with the parasitic losses.

Another problem with conventional Fabry Perot or DFB pump laser is that fluctuations in output power and output spectrum arise from changes in current or temperature. These fluctuations in output power and spectrum result in changes in the gain of the fiber amplifier, and the amplitude of the communications signal becomes unstable. Stabilization of the pump wavelength is required for achieving both gain flatness and for obtaining higher pump power by wavelength division multiplexing (WDM) of several pump lasers.

One approach to overcoming these problems is to operate the pump laser under coherence collapse by feeding the output from the laser to a frequency selective reflector to provide some degree of optical feedback. Operation of a laser under coherence collapse is described further in U.S. patent application Ser. No. 09/375,687, commonly owned with the present application and incorporated herein by reference. Operation under coherence collapse broadens the spectrum of the output from the pump laser, while the frequency selective feedback stabilizes the output wavelength.

One embodiment of a fiber-grating stabilized pump laser is illustrated in FIGS. 2A and 2B, which show orthogonal views of a semiconductor laser 200 whose output is coupled via a lens system 220 to a fiber 230. The lens system 220 may include multiple focusing elements, for example lenses 222 and 224, or may be include a single lens. The laser 200 includes a stripe waveguide section 204 terminated at the rear facet 206, where there is a high reflection coating. The other end of the flared waveguide section is terminated at the output end 208, where there is a low reflectivity coating.

While a laser having a stripe waveguide geometry is illustrated, this is not intended to limit the scope of the invention in any way. It will be appreciated that other semiconductor waveguide geometries may be used in a high power, coherence collapsed pump laser source, including, for example, a flared waveguide geometry, as described in U.S. Pat. Ser. No. 09/375,687, a parallel waveguide having a tapered region to change the waveguide width, as described in U.S. Pat. Ser. No. 09/518,421, incorporated herein by reference, and oscillator/amplifier combinations. These geometries are listed as examples only, and are not intended to provide an exhaustive list of the laser geometries that may be used in the present invention. It is advantageous that the laser be able to operate at high output powers, for example hundreds of mW, without compromising the focusability of the laser output, in order to maximize the amount of pump light that is coupled into the fiber 230.

Light 210 transmitted through the output end 208 of the laser 200 is coupled by the lens system 220 into the input end 232 of the fiber 230. The fiber 230 is typically a single mode fiber and may be coupled directly to the fiber optic communications system to pump an amplifier. The fiber 230 may be a polarization maintaining (PM) fiber. The fiber 230 includes a wavelength selective reflector 234 that reflects sufficient light back to the laser 200 to cause coherence collapse.

Coherence collapse is described in "Regimes of Feedback Effects in 1.5 $\mu$m Distributed Feedback Lasers" by R. W. Tkatch and A of Lightwave Technology, vol. LT-4, pp. 1655–1661, 1986, incorporated herein by reference, and in U.S. Pat. Nos. 5,484,481, 5,563,732 and 5,715,263, also incorporated herein by reference. In the coherence collapse regime, light from the laser is fed back into the laser cavity by an external reflector to perturb the laser spectrum. The onset of coherence collapse depends on several factors, including the reflectivity of the external reflector 234, the bandwidth of the external reflector 234, the separation between the external reflector 234 and the laser 200, and the coherence length of the laser output.

Coherence collapse is characterized by a broad, time-averaged output spectrum, the width of which is related to the width of the reflectivity spectrum of the external reflector. The bandwidth of the coherence-collapsed output is broad, typically of the order of 10–100 GHz or more. This bandwidth is considerably broader than is found in single longitudinal mode operation. This broadened bandwidth enables depolarization of a pump using a reasonable length of fiber. In addition, the spectral density of the coherence-collapsed output is significantly less than that of a multimode Fabry-Perot semiconductor laser. As a result, the onset of SBS in the fiber occurs at significantly higher power levels under coherence-collapse than when conventional DFB or Fabry-Perot lasers are used. Consequently, the coherence collapsed laser is able to operate at a level of hundreds, if not thousands, of mW, without SBS onset, thus providing high pump powers without the attendant parasitic nonlinear losses.

The external reflector 234 may be a fiber Bragg grating (FBG) within the fiber 230 coupled to the laser output. The external reflector 234 may also be some other type of reflector, for example a dielectric coating positioned on a substrate or an input face of the fiber 234, or some other suitable type of reflector that has a reflectance spectrum that may be selected to provide a desired coherence-collapsed laser output spectrum.

The reflectivity of the external reflector 234 is typically less than 10%, for a position approximately within the range 0.1 m to 2 m from the laser, although a much larger distance may separate the external reflector 234 from the laser, for example several meters. The reflectivity of the external reflector 234 is ideally selected to be as low as possible, in order to maximize throughput of the pump light to the fiber system, but should be sufficiently high to lock the laser wavelength to the reflectance spectrum of the external reflector and initiate coherence collapse. Furthermore, certain reflectivities may, for certain separation distances between the external reflector and the laser, prevent coherence collapsed operation. It will be appreciated, therefore, that the reflectivity may be selected to optimize the desired characteristics of the system.

Propagation of the light from the laser 200 through the fiber 230 may be subject to depolarization in the fiber 230, and so the distance between the external reflector 234 and the laser 200 may be reduced to reduce depolarization effects. On the other hand, positioning the external reflector 234 too close to the laser 200 may result in narrow linewidth operation and/or produce mode-hopping instabilities.

In the particular embodiment illustrated, the bandwidth of the output from the laser 200 is determined, at least in part, by the reflectance bandwidth of the FBG 234, which may be selected according to the particular application. The bandwidth is typically in the range 1 GHz, to 1000 GHz, although it may also lie outside this range.

It will be appreciated that the coherence length of a coherence-collapsed laser output may not be as short as might be expected from the overall spectral bandwidth of the output. This may be due to some residual coherence within different, discrete portions of the overall spectral envelope. Under coherence collapse, the spectrum of the output may include a number of peaks whose individual spectral width is narrower than the overall spectral width of the output. In this case, coherence length may be defined as that distance traveled by light in a time equal to the inverse of the narrower width peak in the output spectrum. Coherence length in general may be defined as the path length difference beyond which the interference between the beam and itself is reduced by 3 dB.

One approach to reducing the residual coherence is to dither the drive current of the laser by modulating at a relatively high frequency, for example by applying a 10% modulation at a frequency in the range 1 kHz–1 GHz. Under non-coherence collapse conditions, dithering broadens the bandwidth of each individual Fabry Perot peak. Under coherence collapse, dithering may be used to wash out the coherence of the discrete portions under the overall spectral envelope.

Another advantage provided by control of the laser bandwidth by an external fiber grating is that, where the laser 200 is used to pump a fiber amplifier, the spectrum of the pump light becomes more stable, and is less prone to drift, despite changes in current and temperature operation of the laser 200. The temperature sensitivity of the output spectrum is determined largely by the fiber material, which is over ten times less sensitive to temperature than the semiconductor material of the laser.

It will also be appreciated that depolarized lasers may be useful in other applications, in addition to fiber amplifier pumping. For example, it has been proposed that a laser operating under coherence collapse may be useful as a dummy channel in a WDM multiple-wavelength communications system, see "Laser Source With Controlled Spectral Linewidth to Suppress Stimulated Brillouin Scattering (SBS) and Applications Therefor," U.S. patent application Ser. No. 09/501,712, commonly owned with the present application and incorporated by reference herein. The dummy channel is used for maintaining a substantially constant communications signal level, even in the presence of channel drop or addition, thus maintaining uniform amplifier performance. Without the dummy channel, the drop or addition of a channel would change the saturation characteristics of an amplifier, such as the gain or the gain slope, thus changing the level of signal detected at the receiver. It is useful for the dummy channel to have a broad bandwidth, as is produced by coherence collapse, in order to avoid parasitic nonlinear effects such as SBS. The use of a depolarized source for the dummy channel reduces PDG, thus ensuring that the gain compensation performed by the dummy channel was more uniform.

One particular embodiment of a laser source operating with a depolarizer is illustrated in FIG. 3A. The laser 300 includes a semiconductor laser element 302 whose output is focused via a lens 304, or lens system, into a fiber 306. In this particular embodiment, the fiber 306 includes an FBG 308 to provide wavelength selective feedback to the laser element 302 for wavelength stabilization and operation under coherence collapse. The fiber 306 may be a PM fiber to maintain the original polarization of the light emitted by the laser element 302.

The fiber 306 is coupled to a first input A of a polarization-preserving 2×2 coupler 310. An output fiber 312 is coupled to the first output A' of the 2×2 coupler 310. A feedback path 314 is coupled between the second output B' and the second input B of the 2×2 coupler 310. The feedback path 314 may be a fiber, or some other type of waveguiding element. In this particular embodiment, the feedback path 314 is a PM fiber 315. The feedback fiber 315 is given a 90° twist between its ends. Therefore, the orientation of the polarization axis of the feedback fiber 315 at the second input B, indicated by the dot on the fiber 314 close to the second input B, is rotated 90° to the orientation of the polarization axis of the feedback fiber 315 at the second output B', indicated by the arrow on the fiber 315 close to the second output B'.

Light from the laser source 300 enters the 2×2 coupler 310 through the first input A and is split into two components. The first component 316a is directed to the first output A'. The second component 316b is directed to the second output B'. The light that exits the 2×2 couple 310 through the second output B' is fed back along the feedback fiber 314 into the coupler 310 at the second input B. The polarization of the light entering the 2×2 coupler 310 through the second input B is rotated 90° to the polarization of the light entering the 2×2 coupler 310 through the first input A. The light entering the 2×2 coupler 310 through the second input B is also split into two components. The first component 318a is directed to the second output B'. The second component 318b is directed to the first output A'.

Thus, the light exiting the coupler 310 through the first output A' is a mixture of components 316a and 318b. The light from the first input A, component 316a, has a first polarization, while the light from the second input B, component 318b, is primarily polarized orthogonally to the light from the first input A. Furthermore, where the optical path length of the feedback path 314 is longer than the coherence length of the light entering the coupler 310 from the laser 300, then the light in component 318b is not coherent with the light in component 316a. Therefore, the degree of polarization (DoP) of the light entering the output fiber 312 is less than the DoP of light entering the coupler 310. This type of depolarizer is referred to as a feedback depolarizer.

The amount by which the DoP of the light is reduced depends on several factors, including the DoP of the light entering the coupler 310, the length of the feedback path 314, and the splitting ratio of light from one input to the outputs, and the degree to which the optical components are polarization-preserving. Where the light output from the laser 300 is highly linearly polarized, aligned to a principle axis of the PM fiber, and the feedback path length is significantly longer than the coherence length of the light from the laser 300, then the DoP of the light output from the coupler 310 may be highly depolarized.

Under ideal conditions, and ignoring losses within the depolarizer, the DoP of the light output from the coupler 310 may be substantially reduced to zero where the splitting ratio in the coupler 310 is about 1:2. The splitting ratio is defined as the fraction of light directed from one input to its associated output compared to the fraction of light directed to the other output. Thus, a splitting ratio of 1:2 corresponds to ⅓ of the light entering an input being directed to the corresponding output, and ⅔ of the light being directed to the other output. For example, component 316a carries ⅓ of the light entering the first input A, while component 316b carries the remaining ⅔.

The calculated dependence of the DoP on splitting ratio, a, is illustrated in the graph shown in FIG. 16, for a lossless feedback depolarizer. The calculation assumed that the input light was linearly polarized. The DoP has a minimum at zero, in other words the output is completely depolarized, for a value of a =0.33. The DoP increases from the minimum value by about 2.3% for each 1% mismatch of the splitting ratio. The feedback depolarizer may also produce a completely depolarized output when the depolarizer is lossy. The excess loss, e, of a depolarizer is defined as the loss in excess of the inherent coupling loss. For example, if a coupler is a 3 dB coupler, then the excess loss is any loss in the coupler higher than 3 dB. Furthermore, the excess loss, e, is defined a having a value of 1 when there is no loss, and a value of 0 when the light is completely lost. Therefore, the excess loss, e, as defined, may be regarded as being similar to a measure of transmission. It can be shown that a single stage feedback depolarizer can completely depolarize linearly polarized light when the following condition holds:

$$a = \frac{e}{2e+1}$$

This expression confirms the assertion the DoP goes to zero at a =⅓ when the depolarizer is lossless, in other words when e=1. Furthermore, the ideal splitting ratio to obtain zero DoP is not a strong function of loss. For example, if the excess loss, e=0.9 (10% loss), then the DoP goes to zero when a=0.32.

Furthermore, the total loss, L, of a depolarizer in the presence of excess loss can be shown to be:

$$L = \frac{2I^2}{2I+1-I^2}$$

when the splitting ratio has been adjusted to give zero DoP.

FIG. 17 illustrates how the DoP obtainable from a depolarizer increases with increasing excess loss when the splitting ratio, a, is fixed at a specific value. In the case illustrated, the splitting ratio was selected to be ⅓, resulting in a DoP of zero for zero excess loss. However, when the excess loss increases, the DoP also increases, since the amount of light in the different arms within the depolarizer no longer balances. At an excess loss of 1 dB, the DoP is approximately 6.7%. The graph also illustrates how the total losses of the depolarizer increase with increasing excess loss, rising to almost 2 dB for an excess loss of 1 dB.

The DoP of a feedback depolarizer of the type illustrated in FIG. 3A was measured to be between about 6% and 9%, using a polarized, coherence collapsed laser. The nominal splitting ratio of the polarization maintaining splitter was 70:30. This ratio was different from the ideal splitting ratio by about 3.3%. Using the results of FIG. 16, one would calculate that the expected DoP for a non-optimized splitting ratio would be about 7.5%. Furthermore, the excess loss of the splitter was specified by the manufacturer to be typically 0.05 dB, 0.2 dB maximum. This excess loss would change the DoP by 0.25% and 1% respectively. Thus, the experimental results agree closely with the theoretically predicted behavior.

The expression for L provided above includes the assumption that the excess losses are balanced evenly between the two output ports of the coupler. It can be shown that there is a value of splitting ratio that leads to zero residual polarization also for the more general case where the losses associated with the two output ports are not balanced. That derivation is not included here.

Another embodiment of a feedback depolarizer is illustrated in FIG. 3B. This depolarizer 320 is similar to that illustrated in FIG. 3A. However, in this case, the feedback path is formed by two polarization-maintaining (PM) fibers 324 and 326. The input to the first PM fiber 314 is coupled to the second output B' and the output from the second PM fiber 326 is coupled to the second input B. A polarization transforming element 328, such as a Faraday rotator or half-wave retardation plate, is placed between the fibers 324 and 326 to rotate the polarization of light entering the second input B relative to the light exiting the second output B'. Lenses 330 may be used to couple the light between the fibers 324 and 326.

In another embodiment, not illustrated, the feedback path is formed by two PM fibers coupled respectively at the second output B' and the second input A' with their polarization axes parallel. The two fibers are coupled by a 90° splice.

Different embodiments of 2×2 coupler that may be used in the feedback depolarizer are illustrated in FIGS. 4A–4D. In the embodiment illustrated in FIG. 4A, the 2×2 coupler 400 is formed by fusing, or otherwise attaching, two fibers 402 and 404. The respective fiber cores 406 and 408 are sufficiently close to each other that light from one core 406 leaks into the other core 408 and vice versa. Such a coupler may be made by removing a portion of the cladding layer 410 and 412 of each fiber and fusing the fibers 402 and 404 together. Another approach to forming the coupler 400 is to heat the two fibers 402 and 404 together and draw them down while hot, so that the cores 406 and 408 approach each other.

Another embodiment of a 2×2 coupler 420 is illustrated in FIG. 4B. In this coupler 420, the first input A is coupled to the first output A' by a first waveguide 422, and the second input B is coupled to the second output B' by a second waveguide 424. The waveguides 422 and 424 are formed on a substrate 426. A coupling region 428 is formed where the two waveguides 422 and 424 are spaced apart by a sufficiently short distance that light in one waveguide couples into the other waveguide.

An input fiber 430 couples light into the first input A and an output fiber 432 transmits light exiting the first output A'. Feedback to the coupler 420 is provided by one or more feedback fibers 434 coupled to the second input B and second output B'.

An embodiment of an integrated depolarizer 440 is illustrated in FIG. 4C. In this coupler, a first waveguide 442 forms a coupling region 446 with a second waveguide 444. Both waveguides 442 and 444 are formed on a substrate 448. The second waveguide 444 forms a feedback loop. A polarization rotator 450 is positioned on the second waveguide to rotate the polarization of light passing around the second waveguide loop 444. The polarization rotator may be implemented in any manner that permits rotation of the polarization. For example, in one embodiment, the polarization rotator may be a half-wave retardation plate inserted into a slot cut through the second waveguide 444 into substrate 448. In another embodiment, the polarization rotator may be an electro-optic polarization rotator, for example, implemented in a lithium niobate substrate 448. The propagation time for light passing around the second waveguide loop 444 is preferably longer than the coherence time of the light received into the first waveguide 442 from the light source.

A semiconductor laser 452 may be attached to, or grown on, the substrate 448 in such a manner as to couple light directly into the first waveguide 442. For example, if the substrate is glass, then a laser 452 may be attached to the glass substrate and coupled to the first waveguide 442. If the substrate is a semiconductor material, the laser 452 may be grown on the substrate 452 and the first waveguide 442 formed on the semiconductor substrate to receive the light produced by the laser 452.

Another embodiment of a depolarizer 460 is illustrated in FIG. 4D. The depolarizer 460 includes a multimode interference coupler 462 which has two single mode input waveguides 464 and 466, and two single mode output waveguides 468 and 470. A first multimode interference region 472 connects between the first input waveguide 464 and the second multimode interference region 474. The first multimode interference region 472 splits the one input signal from the first input waveguide 464 into two components of equal amplitude and directs them into the second multimode interference region 474. The second input waveguide 466 is also coupled to the third multimode interference region. The light from the first and second input waveguides 464 and 466 are mixed in the second multimode interference region 474, which has three outputs. The first output 476 couples to the first output waveguide 468. The second and third outputs 478 and 480 couple to a third multimode interference region 482, where the light from the two second and third outputs 478 and 480 is mixed into the second output waveguide 470.

In this particular embodiment, approximately ⅓ of the light entering the coupler 460 from the input fiber 484 is coupled directly to the output fiber 486, and the remaining approximately ⅔ is coupled to the feedback path input 488. Also, approximately ⅔ of the light entering the coupler 460 from the feedback path output 490 is coupled directly to the output fiber 486, while the remainder of the light from the feedback path output 490 is fed to the feedback path input 488. It will be appreciated that other splitting ratios may be achieved by using different embodiments of multimode interference coupler.

The feedback path between the feedback path input 488 and the feedback path output 490 may be provided by one or more feedback fibers or waveguides. The polarization of the light entering the second input waveguide 466, through B, from the feedback path output 490 is substantially orthogonal to the polarization of the light passing out of the second output waveguide 470 into the feedback path input 488, through B'. The feedback path may include a twisted, PM fiber, or may include a polarization rotating element or other polarizing transforming element as described above for other embodiments.

The multimode interference coupler 462 may also be integrated onto a substrate with other components, such as the feedback path or the light source, for example as shown in FIG. 4C.

It will be appreciated that, although only 2×2 couplers have been described for use with a feedback depolarizer, other types of couplers, having larger numbers of inputs and outputs, may be used in a feedback depolarizer. For example, a 3×3 coupler, or, in general, any N×M coupler may be used. The use of a coupler other than a 2×2 coupler may result, however in the introduction of additional losses.

A single stage feedback depolarizer may be used to substantially completely depolarize any arbitrary linear polarization state, and may be built using a micro-optic approach. Where fiber feedback is used, the birefringence of the polarization maintaining fiber allows the single stage feedback depolarizer to substantially depolarize an arbitrary linear polarization state only for certain lengths of PM fiber. The lengths of the PM fiber may be precisely controlled during manufacture, trimmed afterwards using various techniques such as etching close to the core or UV writing. In another approach, a polarization controller 340 may be used to transform the polarization of the input signal to be aligned to the principle axis of the input PM fiber 306, as illustrated in FIG. 3C.

A two stage feedback polarizer may be used to substantially depolarize any arbitrary input polarization state. In a micro-optic approach, this is fairly straightforward and may be achieved by inserting a half waveplate in both feedback loops, oriented at 45 degrees with respect to one another. One particular embodiment of a micro-optic approach, illustrated in FIG. 5A, includes two reflective beamsplitters 502 and 504 in series. The input light 508 is split into two at the beamsplitter reflector 506. The output light component 510 continues towards the second beamsplitter 506. The feedback light component 512 is directed along a feedback path through a first half-wave retardation plate 514. The feedback path may be defined by a number of reflectors 516, or other suitable optical components. The feedback path should be longer than the coherence length of the light to be depolarized in order to depolarize the light passing therethrough. After passing through the half-wave retardation plate, 514, the light 518 is directed to the reflecting surface of the beamsplitter, where it is combined with the input light 506. A portion of the light 518 is reflected as light 510, while the remainder is transmitted as feedback light 512.

The second beamsplitter 504 includes a feedback path 520 similar to that of the first beamsplitter 502, having a half wave retardation plate 522 the fast axis of the second half wave retardation plate, however, is oriented at 450 relative to the fast axis of the first half wave retardation plate 514. This permits the dual stage depolarizer 500 to depolarize any arbitrary input polarization state.

Where the feedback path is implemented in a fiber, the second feedback loop may include a polarization controller, so as to permit the user to adjust the feedback to depolarize any input polarization state. An example of this is illustrated in FIG. 5B, which shows a dual stage depolarizer 530 with two feedback depolarizers 532 and 534 in series. The first depolarizer 532 is similar to that illustrated in FIG. 3A. The second depolarizer 534 includes a polarization controller 536 in the feedback loop 538 for adjusting the polarization of the feedback light. This permits the dual stage depolarizer 530 to depolarize any arbitrary input polarization state.

Another dual stage depolarizer 550, illustrated in FIG. 5C, includes two feedback polarizers 532 and 534 in series. In this particular embodiment, the respective feedback paths 556 and 558 are UV trimmed lengths of PM fiber, trimmed to depolarize any input signal. Alternatively, the feedback paths 556 and 558 may be precise lengths of PM fiber.

Another embodiment of a depolarized light source is illustrated in FIG. 6. A laser 600 includes a semiconductor laser element 602 whose output is focused via a lens 604, or lens system, into a fiber 606. The fiber 606 includes an FBG 608 to provide wavelength selective feedback to the laser element 602 for wavelength stabilization and operation under coherence collapse. The fiber 606 may be a PM fiber to maintain the original polarization of the light emitted by the laser element 602. In this particular embodiment, the laser element 602 is shown to have a stripe waveguide 603, although it will be appreciated that other waveguide geometries of waveguide may be used.

The depolarizer includes a polarization preserving splitter 610, a polarization-preserving combiner 616, both of which may be polarizing beamsplitters, and two fibers 612 and 614 coupled between the splitter 610 and the combiner 616. This type of depolarizer is referred to as a dual arm depolarizer.

Light from the fiber 606 is split in the polarizing splitter 610 into two outputs of orthogonal polarizations. Light having the first polarization propagates along the first fiber 612 and light in the second polarization propagates along a second fiber 614. To achieve perfect depolorization the light must be launched at 45 degrees to the polarizing splitter's primary axis. Both fibers 612 and 614 are PM fibers. The difference in path length between the first and second fibers 612 and 614 is preferably greater than the coherence length of the light emitted by the laser 600. The light from the two fibers 612 and 614 is combined in the polarization-preserving combiner 616. The light from the combiner 616 passes into the output fiber 618. The delay of one polarization relative to the other results in the DoP of the output light being less than the DoP of the light entering the depolarizer.

A fiber polarization controller 620 may be positioned between the laser 600 and the polarization splitter 610 to control the polarization of light entering the splitter 610.

A dual arm depolarizer was tested and showed good depolarization qualities. The light source was a semiconductor laser, grating stabilized and operating in the coherence collapsed mode, emitting polarized light at 1480 nm. The fiber 606 was a length of SMF-28, non-PM fiber. The two fibers 612 and 614 were formed from lengths of PANDA PM fiber. The second fiber 614 was 5–10 m longer than the first fiber 612, representing a path length difference longer than the coherence length of the light source. The splitter 610 and combiner 616 were polarizing beamsplitters. The DoP of light was measured using a Hewlett Packard HP8509 lightwave polarization analyzer. The DoP for light entering the depolarizer was 99.3% and the DoP measured at the output fiber 618 was 1.9%. Thus, the dual arm depolarizer is effective at reducing the DoP of light emitted by a polarized source.

Another embodiment of a depolarized light source is illustrated in FIG. 7. The laser 600, fiber 606 and 608 are similar to those illustrated in FIG. 6. In this particular embodiment, the depolarizer 700 is a fiber Lyot depolarizer. Lyot depolarizers are described in "Degree of Polarization in the Lyot Depolarizer", by W. K. Burns, Journal of Lightwave Technology, Vol. LT-1, No. 3, pp. 475–478, 1983; "Degree of Polarization in Jointed Fibers: Lyot Depolarizer", Kyofumi Mochizuki, Applied Optics, v. 23, no. 19, pp. 3284–3288, "Performance of Lyot Depolarizers with Birefringent Single-Mode Fibers", Journal of Lightwave Technology, v. LT-1, No. 1, p. 71–74; and "Reduction of the Degree of Polarization of a Laser Diode with a Fiber Lyot Depolarizer," J. S. Wang, J. R. Costelloe, and R. H. Stolen, IEEE Photonics Technology Letters, Vol. 11, pp. 1449–1451, 1999. The Lyot depolarizer 700 includes two sections of PM fiber 702 and 704, having different lengths, L1 and L2. The first section 702 is spliced at 710 to the fiber 606. Typically, L2 is about twice the value of L1. The polarization axis of the first fiber 702 is set at about 45° relative to the polarization axis of the second fiber 704 at a splice 712 between the two sections of polarization maintaining fiber 702 and 704. The birefringence of the PM fibers 702 and 704 rotates the polarization of the light received from the laser 700. The fibers 702 and 704 are sufficiently long that the various spectral components of the light are rotated by differing amounts, due to the dispersion of the fibers.

An equivalent way of considering the Lyot depolarizer is that each length of PM fiber delays one polarization with respect to the other until the two polarization states are incoherent relative to each other, in a manner similar to the dual arm depolarizer. The fiber splices at the input and output of each of the lengths of PM fiber operate in the same way as the polarization preserving splitters.

The dual arm depolarizer may be used in a dual stage embodiment to depolarize any input polarization state. The first stage decorrelates the two linear polarization states, which are then launched at the requisite 45° into the second stage. The 45° launch splits the two, now decorrelated, linear polarizations exactly into two halves for the second stage of the depolarizer. The second stage decorrelates these two halves and recombines them, resulting in a depolarized output. The delays used in the dual stage depolarizer are preferably sufficiently long that the possible paths through the dual stage depolarizer a path length difference greater than the coherence length of the input light. The Lyot depolarizer 700 is typically able to depolarize an incoming signal of any polarization.

In an experiment, a Lyot depolarizer was fabricated from two lengths of Fujikura PANDA PM fiber, approximately 67 m and 127 m in length. The Lyot depolarizer was used to depolarize the output from a laser module that had four lasers operating at different wavelengths in the range approximately 1420 nm–1460 nm. The DoP was measured for each laser (LD 1–LD 4) individually as a function of operating current, and the results presented in FIG. 8. At high operating currents, >500 mA, the highest DoP observed was less than 7% and for most lasers was less than or equal to 4%. The DoP was measured using a Hewlett Packard HP 8509 polarization detector. Thus, the Lyot depolarizer was successful at reducing the DoP to low levels where the polarization dependent gain of an amplifier may be reduced to an insignificant level.

Different embodiments of depolarized, coherence collapsed pump source that use a PM fiber depolarizer similar to a Lyot depolarizer are illustrated in FIGS. 15A–15C. In the first embodiment, illustrated in FIG. 15A, the output from a laser 1502 is coupled to a PM fiber 1504. The PM fiber 1504 is provided with a grating 1506 to induce coherence collapse.

The PM fiber 1504 is coupled so that the polarization vector 1508 of the light entering from the laser 1502 is at approximately 45° to the polarization axis of the fiber 1504, as illustrated in the inset A. The inset A schematically illustrates a cross-section through the PM fiber 1504, showing the high stress zones 1510 that produce the birefringence for the PM fiber. Because the light from the laser 1502 is coupled into the fiber 1504 at 45° to the polarization axis of the fiber 1504, the PM fiber 1504 operates similar to a Lyot depolarizer. Since the polarization state of the light emitted by the laser 1502 is known, and enters the PM fiber 1504 in the desired orientation, only a single length of PM fiber is required for the Lyot depolarizer, thus reducing the overall length of PM fiber required to make a depolarized source.

The distance between the grating 1506 and the laser 1502 may be selected to be any length consistent with coherence collapse operation. However, it may be advantageous to place the grating 1506 at a relatively short separation distance from the laser 1502 so that the light reaching the grating 1506 from the laser 1502 has not become significantly depolarized. The polarization selectivity of the amplification process in the laser 1502 may select only certain wavelengths of the light feedback from the grating 1506 if significant depolarization occurs between the laser 1502 and the grating 1506.

Another embodiment of fiber depolarizer is illustrated in FIG. 15B, in which the output from a laser 1522 is coupled into a first PM fiber 1504 having a polarization axis parallel to the polarization vector 1530 of the laser output, as illustrated by inset B. The first fiber 1504 may be the fiber pig-tail of a fiber-coupled laser.

The first PM fiber 1524 is coupled to a second PM fiber 1526 via a 45° splice 1532. Inset C illustrates the relative orientation of the high stress regions 1534 of the first PM fiber 1524 and the high stress regions of the second PM fiber 1526 at the splice 1532. A fiber Bragg grating 1528 is provided in the second PM fiber 1526 to produce coherence collapse.

Another embodiment, illustrated in FIG. 15C, is similar to the embodiment of FIG. 15B, except that the grating 1528 is positioned within the first PM fiber 1524.

An advantage of the embodiments illustrated in FIGS. 15B and 15C is that the PM fiber directly coupled to the laser does not need to be aligned at 45° to the laser output, thus reducing manufacturing complexity. Another advantage is that no depolarization takes place in the first PM fiber 1524, so the light reaching the grating 1528 from the laser 1522 is either not depolarized, or only depolarized by a small amount. It will be understood that this advantage may be lost from the embodiment of FIG. 15B if the grating 1528 is removed far from the splice 1532, thus allowing significant depolarization to take place before the light from the laser 1522 reaches the grating.

In all of the embodiments illustrated in FIGS. 15A–15C, the depolarizer only requires one length of PM fiber, with the polarization of the input at 45° to the polarization axis of the fiber. This is because the polarization of the light entering the depolarizer is controlled. Consequently, the total length of PM fiber required for a fiber depolarizer may be significantly less than the length of fiber required for a conventional Lyot depolarizer that uses two lengths of PM fiber spliced at 45°. Furthermore, in embodiments of the present invention, the length of PM fiber used in the depolarizer is the length of the shorter fiber of the conventional Lyot, two-fiber depolarizer.

One important feature of the invention comes from the realization that the use of a grating stabilized semiconductor laser operating under coherence collapse substantially reduces delay lengths needed in a depolarizer due to the reduced coherence length of these types of sources. For example, a pump laser operating conventionally with Fabry Perot modes has a bandwidth of approximately 10–1000 MHz, the width of a single mode, which corresponds to a coherence length of 0.3 to 30 meters. In contrast, a pump source operating under coherence collapse has a bandwidth of approximately 1–1000 GHz, essentially the bandwidth of the fiber grating, corresponding to a coherence length of 0.3 mm to 30 cm. This results in depolarizers being implemented with a greatly reduced length of PM fiber, and hence reduced cost. Thus, a depolarizer that is used for depolarizing the output from a light source operating in coherence collapse may be ineffectual at depolarizing the light from the source if the source operates in a non-coherence collapsed, narrowband mode. For example, if the laser jumps from a coherence collapsed mode, with short coherence length, to a Fabry Perot mode, with long coherence length, the depolarizer may fail to depolarize the light if it is designed only to operate for the short coherence length of the coherence collapsed mode.

Different schemes for combining outputs from different laser sources in a depolarized source are illustrated in FIGS. 9A and 9C. In FIG. 9A, a first laser 902 is coupled through a first fiber 904 to a first depolarizer 906 (labeled "dp"). A second laser 910 is coupled through a second fiber 912 to a second depolarizer 914. The fibers 904 and 912 may include respective FBGs 908 and 916 to control the wavelengths of the respective lasers 902 and 910 and to induce coherence collapse. The outputs from the depolarizers 906 and 914 may be combined in a WDM coupler 918. It will be appreciated that the FBGs 908 and 916 may also be positioned on the far sides of the respective depolarizers 906 and 914.

In FIG. 9B, a single depolarizer 922 is positioned after the combiner 920, and is used to depolarize the output from both lasers 902 and 910.

It will be appreciated that the embodiments illustrated in FIGS. 9A and 9B need not be limited to two lasers, and that each embodiment may be adapted to operate with more than two laser sources.

There exist at least two different classes of fiber Raman amplifiers. The first class, illustrated in FIG. 1, is referred to as a distributed amplifier. In the distributed amplifier, the Raman pump signal is injected into the communication fiber and propagates for as long losses, due either to the fiber or depletion by the communications signal, allow. The distributed amplifier is typically several kilometers long, for example up to 20 km or longer.

Another class of fiber Raman amplifier is the discrete amplifier, different embodiments of which are illustrated in FIGS. 10A–10C. A discrete amplifier is typically enclosed within a self-contained package, having an input and an output, and may be inserted an any suitable point along a communications fiber.

The first embodiment of a discrete Raman amplifier, illustrated in FIG. 10A, includes a laser source 1002, typically a semiconductor laser element 1004 whose output is focused into a pump fiber 1006 by a lens 1008, or lens system. An FBG 1010 or other type of wavelength selective reflector may be used to stabilize the laser wavelength and to operate the laser source 1002 under coherence collapse. A depolarizer 1012 depolarizes the output from the laser 1002 so that the pump light at the pump wavelength, $\mu$p, is depolarized. It will be appreciated that the depolarized laser source may employ any of the embodiments disclosed herein, For example, the depolarizer 1012 may be located between the FBG 1010 and the laser source 1002, as illustrated, or the FBG may be located between the depolarizer 1012 and the laser source 1002.

The discrete amplifier 1000 has an amplifier fiber 1014 connected between an input coupler 1016 and an output coupler 1018. The amplifier fiber 1014 passes through a coupler 1020 where pump light at $\lambda$p is coupled from the pump fiber 1006 to the amplifier fiber 1014. The external fibers 1020 and 1022 carrying the communications signal at the communications wavelength, $\lambda$c, are coupled to the input and output couplers 1016 and 1018 respectively.

The pump laser wavelength $\lambda$p is one Stokes shift shorter in wavelength than the communications wavelength, $\lambda$c. Thus, for a typical fiber where the communications wavelength is about 1550 nm, the pump wavelength, $\lambda$p, is about 1455 nm. The discrete amplifier is typically arranged in a counter-propagating arrangement in order to take advantage of the longer averaging time discussed above, and the lower PDG.

One disadvantage of the simple approach of the discrete amplifier 1000 is that a large amount of power is required to achieve gain in short lengths of fiber and much of the pump power is wasted, passing out of the end of the amplifier fiber 1014 into the communications fiber 1020. One approach to reducing the amount of pump light lost out of the fiber is to use an amplifier fiber 1014 whose core is smaller than the core of the communications fibers 1020 and 1022. This may be achieved, for example, by using a core having a high germanium content. A smaller core fiber confines the light more tightly, thus increasing the optical intensity within the fiber, which results in more efficient nonlinear interactions. Thus, the fiber Raman gain is increased with a smaller core fiber. Additionally, an increased germanium content also increases the Raman gain cross-section, further increasing the Raman gain. The increased Raman gain results in the pump light being depleted in a shorter length of fiber.

Another approach to reducing the length of amplifier fiber used in the discrete amplifier is illustrated in FIG. 10B for the discrete amplifier 1030. In this embodiment, a fiber grating 1032 that reflects light at the pump wavelength, $\lambda$p, is written into the amplifier fiber 1014. By reflecting the pump light within the fiber 1014, the grating 1032 increases the pump intensity within the amplifier fiber 1014. The higher pump intensity permits the use of shorter amplifier fiber 1014, a reduction in pump power, or a combination of the two. One possible disadvantage of this arrangement is that the pump beam propagates in both directions along the fiber, and the co-propagating portion has a lower time averaging of pump noise.

Another embodiment of discrete Raman amplifier 1040, illustrated in FIG. 10C, uses a three wavelength scheme, rather than the two wavelength scheme of the embodiments illustrated in FIGS. 10A and 10B. The amplifier fiber 1014 is provided with two FBGs 1042 and 1044 that are highly reflective at a second wavelength, $\lambda$s. The second wavelength, $\lambda$s, is selected to be a wavelength that is amplified by the pump wavelength, $\lambda$p, through Raman amplification. The second wavelength, $\lambda$s, may be, for example, shifted from the pump wavelength, $\lambda$p, by the first Stokes shift of the fiber. The two FBGs 1042 and 1044 form a resonator at $\lambda$s. Pumping the resonator with the pump beam from the pump fiber 1006 results in an intense signal at $\lambda$s within the resonator. The first FBG 1042 may also be reflective at the pump wavelength, $\lambda$p, in order to reflect any pump light escaping from the resonator back into the resonator for conversion to the second wavelength, $\lambda$s.

The input coupler 1016 may be coupled to an input fiber 1020 from an external fiber system operating at the communications wavelength, $\lambda$c, for example approximately 1550 nm. The signal at $\lambda$c passes through the amplifier fiber 1014, and through the output coupler 1018 which is coupled to an output fiber 1022 connected to the external fiber system. The second wavelength, $\lambda$s, in the fiber Raman resonator, is selected to be shifted from the communications wavelength, $\lambda$c, by the Stokes shift of the amplifier fiber 1014. Therefore, the communications signal at $\lambda$c is amplified by Raman amplification on passing through the resonator.

Where the discrete Raman amplifier 1040 is used in a communications system operating at about 1550 nm, and where the Stokes shift in the fiber 814 is about 13000 GHz, the amplifier wavelength, $\lambda$a, is about 1455 nm. The pump signal is also shifted from the amplifier wavelength by the Stokes shift, and has a wavelength of about 1365 nm.

Advantages of the discrete fiber Raman amplifier include avoiding the need to transmit a high power pump beam down the communications fiber. Furthermore, the Raman gain properties of the amplifying fiber may be controlled and chosen to enhance Raman amplification, rather than relying on the often less suitable Raman properties of the communications fiber itself. Consequently, it may sometimes more convenient to package a discrete amplifier in a single package that can be dropped into a fiber system, although it does not preserve the signal to noise ratio (SNR) of the signal as well as a distributed amplifier A combination of multiple laser sources may be used, for example, for pumping one or more fiber devices, such as fiber lasers or fiber amplifiers, as illustrated in FIG. 11. The scheme may be used with any number of pump lasers, and the illustrated embodiment having N pump lasers 1101a, 1101b, . . . 1101n. The light 1110 from each laser 1101a, 1101b, . . . 1101n is focused by a respective lens system 1120 into a respective fiber 1130. Each fiber 1130 includes an FBG 1132a, 1132b, . . . . 1132n to control each laser 1101a, 1101b, . . . 1101n to operate in the coherence-collapsed regime at respective wavelengths $\lambda$1, $\lambda$2, . . . $\lambda$N. Some, or all, of the respective wavelengths $\lambda$1, $\lambda$2, . . . $\lambda$N may be the same, or they all may be different. Depolarizers 1126 depolarize the output from the pump lasers 1101a, 1101b. . . 1101n.

Light from the different lasers 1101a, 1101b, . . . 1101n is combined in a combiner 1140, to provide outputs that include a combination of light from each pump laser 1101a, 1101b, . . . 1101n, or from some subcombination of the pump lasers 1101*a*, 1101*b*, . . . 1101*n*. The combiner 1140 may be any suitable type of combiner, for example, a star coupler, a WDM coupler, a stack of y-couplers, or the like.

The combiner 1140 may have a single output, or may have multiple outputs. The embodiment illustrated has M outputs feeding to M different output fibers 1150*a*, 1150*b*, . . . 1150*m* optically connected, via respective fiber-to-fiber couplers 1151*a*, 1152*b*, . . . 1152*m*, to respective fiber devices 1152*a*, 1152*b*, . . . 1152*m*. Each of the fiber devices 1152*a*. . . 1152*m* may be any type of fiber device, for example, a fiber laser, such as a rare-earth doped Fabry-Perot or DFB fiber laser or a Raman oscillator, or a fiber amplifier, such as rare-earth-doped amplifier or a Raman amplifier. Some of the fiber devices may be coupled to an optical communications system. The output fibers 1150*a*, 1150*b*, . . . 1050*m* themselves may include fiber devices, so that, for example, the output from the coupler 1140 is fed directly into a number of fiber lasers.

Furthermore, one or more of the fiber devices 1150*a*, 1150*b*, . . . 1150*m* may be a distributed feedback (DFB) fiber laser. The structure of a DFB fiber laser is different from a conventional laser that uses, for example mirrors or Bragg gratings, to provide localized feedback. The DFB fiber lasers include excitable fibers, for example rare-earth doped fibers. The doped fiber is overwritten with an FBG, so that the laser gain region extends through the fiber grating. The DFB-FBG typically has a $\lambda/4$ phase shift part way along the grating to increase output wavelength stability. An advantage provided by a fiber DFB is that the mode is more stable than, for example, a Fabry Perot fiber laser, which may suffer from mode hopping. Typically, fiber DFB lasers are limited in output power, because of the difficulty in generating an FBG that is longer than a few cm in length, and so a DFB fiber laser may be followed by a fiber amplifier section in order to boost power.

Fiber DFB laser and Fabry-Perot lasers that use a fiber FBG may be tuned, for example, by stretching that portion of the fiber containing the grating. The fiber medium may be polarization maintaining, or may be non-polarization maintaining.

Multiple depolarized lasers may be used for pumping multiple fiber Raman amplifiers, as is illustrated in the embodiment shown in FIG. 12A. Here, the pump light is combined in a wavelength multiplexer 1240. Three pump sources 1200*a*, 1200*b* and 1200*c*, are illustrated, but it will be appreciated that other numbers of pump lasers may also be used.

Each pump source 1200*a*, 1200*b* and 1200*c* includes a respective laser element 1201*a*, 1201*b*, and 1201*c*. Light 1210 from each of the laser elements 1201*a*, 1201*b*, and 1201*c* is coupled into respective fibers 1230 by respective lens systems 1220. The fibers 1230 include FBGs 1232*a*, 1232*b* and 1232*c* to control the lasers 1201*a*, 1201*b* and 1201*c* to operate in the coherence-collapsed regime at respective wavelengths $\lambda 1$, $\lambda 2$ and $\lambda 3$. The output from each laser element 1201*a*, 1201*b* arid 1201*c* is combined in the WDM combiner 1240 to provide light in an output 1238 that includes light at all three pump wavelengths $\lambda 1$, $\lambda 2$ and $\lambda 3$.

The output from the WDM combiner 1240 is passed through a depolarizer 1235 before being directed from the fiber output 1238 through one or more coupling fibers, for example coupling fibers 1250*a*, 1250*b* and 1250*c*, to a number of fiber devices 1252*a*, 1252*b* and 1252*c* respectively, through respective couplers 1251*a*, 1251*b* and 1251*c*. It will be appreciated that the light from the output 1238 may be connected to other numbers of fiber devices. The fiber devices 1252*a*–1252*c* may be excitable fiber devices, such as Raman-based devices or rare-earth-doped fiber devices. For example, the fiber devices 1252*a*–1052*c* may be Raman amplifiers, each comprising a length of Raman excitable fiber, coupled to amplify signals received from an optical communications system.

This embodiment is advantageous because it provides a pump source operating at a number of discrete wavelengths, where the power level at each wavelength is independently adjustable relative to the power levels at the other wavelengths. This may be advantageous for tailoring the pump light spectrum to a particular spectral profile, for gain equalization, for compensating pump power depletion, and for dynamic pump control.

For example, this embodiment may be advantageous for pumping Raman systems, as is further explained with reference to FIG. 12B. A Raman gain profile is associated with each of the pump wavelengths. The figure shows two Raman gain profiles, G1 and G2, that are associated with two different pump wavelengths, $\lambda 1$ and $\lambda 2$. Only two gain profiles G1 and G2 are shown for clarity. It will be understood that a pump source may use more than two pump wavelengths to provide a total gain profile that is a combination of the gain profiles of each pump wavelength.

The shapes of the individual Raman gain profiles G1 and G2 are essentially identical, but are shifted from each other in wavelength by the difference between $\lambda 1$ and $\lambda 2$. The total Raman gain profile, Gt, is the sum of the gain profiles associated with each of the pump wavelengths. Therefore, for this example, Gt=G1+G2, where the gain is given in dB. By judicious selection of the pump wavelengths, the individual Raman gain profiles resulting from each individual pump beam may be positioned so as to smooth out nonuniformities in the Raman gain. For example, the total gain profile Gt is smoother than the individual profiles G1 and G2. Thus the overall Raman gain in a Raman amplifier or resonator may be tailored to be relatively flat over a particular wavelength range. Furthermore, the total gain profile Gt has a broader bandwidth than a single individual Raman gain profile. The use of multiple, independent pump sources provides increased pump bandwidth, a flatter gain profile and permits dynamic control of the Raman gain.

While various examples were provided above, the present invention is not limited to the specifics of the examples. For example, different types of pump lasers may be used in the different embodiments shown, including single stripe, tapered stripe and flared stripe lasers. Also, the use of a particular type of element in a figure is not intended to restrict the scope of the invention to that type of element. For example, several of the figures illustrate the use of a fiber-to-fiber coupler of the type in which the cores of each fiber are exposed and placed close to each other so that light in the core of one fiber can leak into the core of the other fiber. Other types of coupler may be used for coupling from one fiber to another, for example micro-optic couplers.

As noted above, the present invention is applicable to semiconductor lasers. While having use in many different applications, it is believed to be particularly useful in depolarizing the output from a laser for pumping a Raman-based fiber amplifier. Accordingly, the present invention should not be considered limited to the particular examples described above, but rather should be understood to cover all aspects of the invention as fairly set out in the attained claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A laser system, comprising:
    a coherence-collapsed laser source including a semiconductor laser element emitting a polarized output; and
    a depolarizer coupled via a polarization maintaining path to the laser element to receive the polarized output and configured to depolarize the polarized output from the laser element to produce a depolarized laser signal.

2. A system as recited in claim 1, wherein the semiconductor laser element emits the polarized output from an output end, the laser source further including an optical fiber having an input end and having a wavelength-selective reflector, the input end of the optical fiber being optically coupled to the output end of the semiconductor laser element to receive the polarized output, whereby feedback of at least a portion of the output from the laser element by the wavelength-selective reflector causes the laser source to operate in coherence collapse.

3. A system as recited in claim 2, wherein the wavelength-selective reflector is disposed between the input end of the optical fiber and the depolarizer.

4. A system as recited in claim 2, wherein the depolarizer is disposed between the input end of the optical fiber and the wavelength selective reflector.

5. A system as recited in claim 1, wherein the semiconductor laser element includes an active waveguide having an output end emitting the polarized output and another end, a width of the waveguide at the output end being greater than a width of the waveguide at the other end.

6. A system as recited in claim 1, wherein a coherence length of the depolarized laser signal less than approximately 30 cm.

7. A system as recited in claim 1, further comprising a controller coupled to the laser source.

8. A system as recited in claim 7, wherein the controller includes a power supply coupled to the laser source to provide current to the laser source, and a temperature controller coupled to the laser source to control a temperature of the laser source.

9. A system as recited in claim 8, wherein the power supply is a dithering power supply to direct a dithered supply current to the laser source.

10. A system as recited in claim 1, wherein the depolarizer includes an input coupled to a splitter disposed to split light from the input along first and second polarization-preserving paths, a combiner disposed to combine light from the first and second polarization-preserving paths, and a depolarizer output coupled to the combiner to transmit an output of light combined from the first and second polarization preserving paths, wherein a difference in path lengths between the first and second polarization-preserving paths is greater than a coherence length of the depolarized pump light.

11. A system as recited in claim 10, wherein the depolarizer further includes a 2×2 polarization preserving coupler forming the polarizing splitter and polarizing combiner, a first coupler input forming the depolarizer input, a first coupler output forming the depolarizer output, the first polarization-preserving path formed between the first coupler input and the first coupler output, a feedback path coupling between a second coupler output and a second coupler input forming the second polarization-preserving path, polarization of light passing through the second coupler output being approximately orthogonal to polarization of light passing through the second coupler input.

12. A system as recited in claim 11, further comprising a polarization-maintaining fiber disposed between the second coupler output and the second coupler input, a polarization axis of the polarization-maintaining fiber at the second coupler output being approximately orthogonal to the polarization axis of the polarization-maintaining fiber at the second coupler input.

13. A system as recited in claim 10, wherein the splitter is a polarizing splitter and the combiner is a polarizing combiner, the first polarization-preserving path includes a first length of polarization-preserving fiber, coupled between the polarizing splitter and the polarizing combiner, and the second polarization-preserving path includes a second length of polarization-preserving fiber coupled between the polarizing splitter and the polarizing combiner, an optical path length of the first length of polarization-preserving fiber being different from an optical path length of the second length of polarization-preserving fiber by an amount at least equal to a coherence length of the polarized laser signal.

14. A system as recited in claim 1, wherein the depolarizer includes a Lyot depolarizer coupled between the laser source and the fiber output.

15. A system as recited in claim 1, wherein the depolarizer includes a polarization maintaining fiber coupled to receive the polarized output from the semiconductor laser element, a polarization axis of the polarization maintaining fiber being oriented at approximately 45° to a polarization direction of the polarized output.

16. A system as recited in claim 15, further comprising a fiber Bragg grating disposed within the polarization maintaining fiber to provide optical feedback to the semiconductor laser element.

17. A system as recited in claim 16, wherein the fiber Bragg grating is disposed at a position within the polarization maintaining fiber relatively close to the semiconductor laser element so that polarization of the polarized output from the semiconductor laser element is substantially unchanged at the fiber Bragg grating.

18. A system as recited in claim 1, wherein the semiconductor laser element is optically coupled to a first length of polarization maintaining fiber, a polarization axis of the first length of polarization maintaining fiber being oriented approximately parallel to a polarization direction of the polarized output, and a second length of polarization maintaining fiber coupled to the first length of polarization maintaining fiber with a polarization axis of the second length of polarization maintaining fiber oriented at about 450 relative to the polarization axis of the first length of polarization maintaining fiber.

19. A system as recited in claim 18, further comprising a fiber Bragg grating disposed within the first length of polarization maintaining fiber to reflect light to the semiconductor gain element, thereby causing the laser source to operate in coherence collapse.

20. A system as recited in claim 18, further comprising a fiber Bragg grating disposed within the second length of polarization maintaining fiber to reflect light to the semiconductor gain element, thereby causing the laser source to operate in coherence collapse.

21. A system as recited in claim 1, further comprising a fiber Raman amplifier coupled to receive the depolarized laser signal.

22. A system as recited in claim 21, wherein the depolarized laser signal co-propagates with a signal to be amplified in the fiber Raman amplifier.

23. A system as recited in claim 21, wherein depolarized laser signal counter-propagates with a signal to be amplified in the fiber Raman amplifier.

24. A system as recited in claim 21, further comprising a fiber optic communications transmitter unit and a fiber optic communications receiver unit, a fiber optic communications link being coupled between the fiber optic communications transmitter unit and the fiber optic communications receiver unit, the fiber Raman amplifier being integrated with the fiber optic communications link to amplify communications signals passing from the fiber optic communications transmitter unit to the fiber optic communications receiver unit.

25. A system as recited in claim 21, wherein the depolarized light is at a first wavelength, and the fiber Raman amplifier includes a length of amplifier fiber positioned between two fiber reflectors disposed to form a fiber resonating cavity at a second wavelength different from the first wavelength, the ends of the amplifier fiber being couplable to an external fiber system for amplifying optical signals at a third wavelength different from the first and the second wavelengths.

26. A system as recited in claim 21, wherein the fiber Raman amplifier is a discrete amplifier having an input and an output couplable to an external fiber system, an amplifier fiber being coupled between the input and output.

27. A system as recited in claim 26, wherein the amplifier fiber includes a fiber Bragg grating disposed to reflect light received from the laser source.

28. A device as recited in claim 21, wherein polarization dependent gain of the fiber Raman amplifier is less than approximately 0.5 dB.

29. An optical fiber system, comprising:
coherence collapsed light emitting means for emitting polarized light;
light depolarizing means for depolarizing the polarized light received from the light emitting means via a polarization preserving path; and
fiber amplifying means coupled to receive depolarized light from the light depolarizing means.

30. A pump light source for pumping a fiber amplifier, comprising:
at least two coherence collapsed lasers emitting pump light from at least two respective outputs;
at least one depolarizer disposed to depolarize pump light from the at least two coherence collapsed lasers; and
a combiner to combine light from the at least two coherence collapsed lasers, the combiner having at least one output fiber couplable to one or more active fiber devices.

31. A pump light source as recited in claim 30, wherein light from at least two of the at least two coherence collapsed lasers is combined before passing through one of the at least one depolarizers.

32. A pump light source as recited in claim 30, wherein the combiner is an N×M coupler, and light is coupled out of the N×M coupler to at least one output fiber.

33. A pump light source as recited in claim 30, wherein the combiner is a wavelength division multiplexer, and light is coupled out of the wavelength division multiplexer to the at least one output fiber.

34. A pump light source as recited in claim 30, wherein the at least one depolarizer is disposed on an output side of the combiner.

35. A laser system, comprising:
a laser source including a semiconductor laser element emitting a polarized output;
a wavelength selective reflector disposed to feed a portion of the output back to the laser element, whereby a coherence length of the polarized output is reduced; and
a depolarizer disposed to depolarize the output from the laser element.

36. A system as recited in claim 35, further comprising an optical fiber coupled to receive the polarized output from the laser element, the wavelength selective reflector including a fiber Bragg grating disposed within the optical fiber.

37. A system as recited in claim 35, wherein the depolarizer is a polarization maintaining fiber coupled to receive the polarized output from the laser element, the polarization maintaining fiber having a polarization axis oriented at approximately 45° relative to a polarization direction of the polarized output.

38. A system as recited in claim 35, wherein the depolarizer is a Lyot depolarizer.

39. A system as recited in claim 35, wherein the depolarizer is a dual arm polarizer.

40. A system as recited in claim 35, wherein the depolarizer is a feedback depolarizer.

41. A laser system, comprising:
a laser source including a semiconductor laser element emitting a polarized output having a coherence length less than 30 cm; and
a depolarizer disposed to depolarize the polarized output from the laser element.

42. A system as recited in claim 41, wherein the laser source further includes a wavelength selective reflector disposed to feed a portion of the output from the laser element back to the laser element, whereby the laser source operates in coherence collapse.

43. A system as recited in claim 41, further comprising a dithering power supply coupled to the laser element to provide a dithered drive current to the laser element.

44. A system as recited in claim 41, wherein the depolarizer includes a polarization maintaining fiber coupled to receive the polarized output from the laser element, the polarization maintaining fiber having a polarization axis oriented at about 45° relative to a polarization direction of the polarized output.

45. A laser system, comprising:
a semiconductor laser element emitting a polarized output; and
a polarization maintaining fiber coupled to receive the polarized output from the semiconductor laser element, a polarization axis of the polarization maintaining fiber being oriented at approximately 45° relative to a polarization direction of the polarized output from the laser element.

46. A system as recited in claim 45, further comprising a power supply coupled to provide operating current to the semiconductor laser element.

47. A system as recited in claim 45, further comprising a fiber Bragg grating disposed within the polarization maintaining fiber to reduce a coherence length of the polarized output.

48. A system as recited in claim 47, wherein the semiconductor laser element operates under coherence collapse with feedback from the fiber Bragg grating.

49. A system as recited in claim 47, wherein the fiber Bragg grating is disposed at a position within the polarization maintaining fiber relatively close to the semiconductor laser element so that polarization of the polarized output from the semiconductor laser element is substantially unchanged at the fiber Bragg grating.

50. A laser system, comprising:
a semiconductor laser element producing an output signal and being operable in a first operating mode with the output signal having a first coherence length and in a second operating mode with the output signal having a second coherence length less than the first coherence length; and a depolarizer disposed on a light path from the laser element, a degree of polarization of light output by the depolarizer having the first coherence length being substantially similar to a degree of polarization of light entering the depolarizer having the first coherence length, and a degree of polarization of light output by the depolarizer having the second coherence length being substantially less than a degree of polarization of light entering the depolarizer having the second coherence length.

51. A system as recited in claim 50, further comprising a wavelength selective reflector disposed to feed a portion of the output signal back to the laser element whereby the semiconductor laser operates in the second operating mode.

52. A system as recited in claim 51, wherein the wavelength selective reflector is a fiber Bragg grating.

* * * * *

UNITED STATES PATENT AND TRADEMARK OFFICE
CERTIFICATE OF CORRECTION

PATENT NO. : 6,760,151 B1
DATED : July 4, 2004
INVENTOR(S) : Vail et al.

It is certified that error appears in the above-identified patent and that said Letters Patent is hereby corrected as shown below:

Column 5,
Line 23, "Poincare" should read -- Poincaré --.

Column 15,
Line 54, "depolorization" should read -- depolarization --.

Column 24,
Line 45, "450 relative" should read -- 45° relative --.

Signed and Sealed this

Sixth Day of September, 2005

JON W. DUDAS
*Director of the United States Patent and Trademark Office*